United States Patent
Yen et al.

(10) Patent No.: US 10,686,146 B2
(45) Date of Patent: Jun. 16, 2020

(54) PARACYCLOPHANE-BASED IRIDIUM COMPLEXES FOR ORGANIC ELECTROLUMINESCENCE DEVICE

(71) Applicants: Feng-Wen Yen, Taipei (TW); Cheng-Hao Cheng, Hsinchu (TW)

(72) Inventors: Feng-Wen Yen, Taipei (TW); Cheng-Hao Cheng, Hsinchu (TW)

(*) Notice: Subject to any disclaimer, the term of this patent is extended or adjusted under 35 U.S.C. 154(b) by 461 days.

(21) Appl. No.: 15/430,558

(22) Filed: Feb. 13, 2017

(65) Prior Publication Data
US 2018/0233677 A1   Aug. 16, 2018

(51) Int. Cl.
*H01L 51/50* (2006.01)
*H01L 51/00* (2006.01)
*C09K 11/06* (2006.01)
*C07F 15/00* (2006.01)

(52) U.S. Cl.
CPC ...... *H01L 51/0085* (2013.01); *C07F 15/0033* (2013.01); *C09K 11/06* (2013.01); *C09K 2211/1007* (2013.01); *C09K 2211/1011* (2013.01); *C09K 2211/1029* (2013.01); *C09K 2211/185* (2013.01); *H01L 51/5016* (2013.01); *H01L 2251/5384* (2013.01)

(58) Field of Classification Search
CPC ............ C07F 15/0033; H01L 51/0085; H01L 51/5016; H01L 51/006; H01L 51/0067; H01L 51/0068; H01L 51/0072; H01L 51/5056; H01L 51/5072; H01L 51/5088; H01L 51/5092; H01L 51/5234; H01L 51/0052; H01L 27/3213; C09K 11/06; C09K 2211/185; C09K 2211/1007; C09K 2211/1011; C09K 2211/1029

USPC ......... 546/4; 428/690, 691, 917; 427/58, 66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 6,835,469 B2 | 12/2004 | Kwong et al. |
| 6,916,554 B2 | 7/2005 | Ma et al. |
| 7,011,897 B2 | 3/2006 | Thompson et al. |
| 7,429,426 B2 | 9/2008 | Brown et al. |
| 7,709,100 B2 | 5/2010 | Kwong et al. |
| 7,851,072 B2 | 12/2010 | Kwong et al. |

(Continued)

FOREIGN PATENT DOCUMENTS

| WO | WO-2010067708 A1 * | 6/2010 | ............. C09K 11/06 |
|---|---|---|---|
| WO | WO-2011107491 A1 * | 9/2011 | .......... C07F 15/0033 |

OTHER PUBLICATIONS

Xu et al., "Prediction of glass transition temperatures of OLED materials using topological indices" Journal of Molecular Modeling (2005) vol. 12, pp. 24-33. (Year: 2005).*

(Continued)

*Primary Examiner* — Dylan C Kershner

(57) ABSTRACT

Provided a paracyclophane-based iridium complexes and the phosphorescent organic EL device employing the paracyclophane-based iridium complexes as light emitting dopant of emitting layer can display good performance like as lower driving voltage, power consumption, increasing efficiency and life time. Additional, the present invention provide the suitable emitting host (H1 to H8) to collocate with the energy level of paracyclophane-based iridium complexes for the present invention.

17 Claims, 1 Drawing Sheet

| 14 | — metal electrode |
| 13 | — electron injection layer |
| 12 | — electron transport layer |
| 11 | — hole blocking layer |
| 10 | — emitting layer |
| 9 | — electron blocking layer |
| 8 | — hole transport layer |
| 7 | — hole injection layer |
| 6 | — transparent electrode |

(56) References Cited

U.S. PATENT DOCUMENTS

| | | | |
|---|---|---|---|
| 8,269,317 B2 | 9/2012 | Alleyne et al. | |
| 8,492,006 B2 | 7/2013 | Ma et al. | |
| 8,519,384 B2 | 8/2013 | Xia et al. | |
| 8,557,400 B2 | 10/2013 | Xia et al. | |
| 8,778,508 B2 | 7/2014 | Kwong et al. | |
| 2003/0068526 A1* | 4/2003 | Kamatani | C07F 15/004 428/690 |
| 2003/0072964 A1* | 4/2003 | Kwong | C07D 215/04 428/690 |
| 2004/0004594 A1* | 1/2004 | Kato | G02F 1/133603 345/87 |
| 2005/0164030 A1* | 7/2005 | Knowles | C07F 15/0033 428/690 |
| 2009/0108737 A1* | 4/2009 | Kwong | H01L 51/0085 313/504 |
| 2009/0145483 A1* | 6/2009 | Kim | C07F 15/0033 136/263 |
| 2010/0090591 A1* | 4/2010 | Alleyne | C09K 11/06 313/504 |
| 2010/0123127 A1* | 5/2010 | Inoue | C09K 11/06 257/40 |
| 2012/0068165 A1* | 3/2012 | Hayashi | C09K 11/06 257/40 |
| 2012/0119190 A1 | 5/2012 | Alleyne et al. | |
| 2012/0181511 A1 | 7/2012 | Ma et al. | |
| 2012/0299468 A1* | 11/2012 | Tsai | H01L 51/0085 313/504 |
| 2012/0319146 A1* | 12/2012 | Adamovich | H01L 51/504 257/89 |
| 2013/0032785 A1 | 2/2013 | Ma et al. | |
| 2013/0146848 A1 | 6/2013 | Ma et al. | |
| 2013/0328019 A1 | 12/2013 | Xia et al. | |
| 2014/0008617 A1 | 1/2014 | Beers et al. | |
| 2014/0284585 A1 | 9/2014 | Kwong et al. | |
| 2015/0001472 A1 | 1/2015 | Boudreault et al. | |
| 2015/0115250 A1 | 4/2015 | Ma et al. | |
| 2015/0214492 A1* | 7/2015 | Yen | H01L 51/0072 257/40 |

OTHER PUBLICATIONS

Zhao et al., "Synthesis and Photophysical, Electrochemical, and Electrophosphorescent Properties of a Series of Iridium(III) Complexes Based on Quinoline Derivatives and Different â-Diketonate Ligands" Organometallics (2006) vol. 25, pp. 3631-3638. (Year: 2006).*

Satou Tasuku, machine translation of WO-2010067708-A1 (2010), pp. 1-47. (Year: 2010).*

Cichosch Alexander, machine translation of WO-2011107491-A1 (2011), pp. 1-13. (Year: 2011).*

Sun et al., "Management of singlet and triplet excitons for efficient white organic light-emitting devices" Nature Letters, vol. 440, Apr. 13, 2006, pp. 908-912. (Year: 2006).*

* cited by examiner

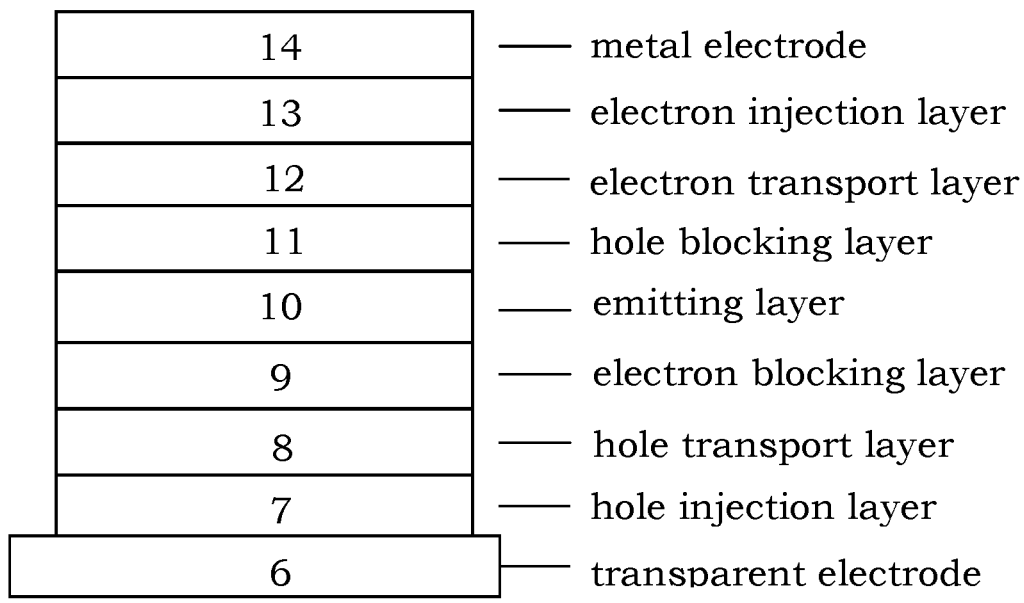

PARACYCLOPHANE-BASED IRIDIUM COMPLEXES FOR ORGANIC ELECTROLUMINESCENCE DEVICE

FIELD OF INVENTION

The present invention generally relates to a paracyclophane-based iridium complexes and organic electroluminescence (herein referred to as organic EL) device using the paracyclophane-based iridium complexes. More specifically, the present invention relates to the paracyclophane-based iridium complexes having general formula(1), an organic EL device employing the paracyclophane-based iridium complexes as phosphorescent dopant of emitting layer.

BACKGROUND OF THE INVENTION

Organic electroluminescence (organic EL) is a light-emitting diode (LED) in which the emissive layer is a film made by organic compounds which emits light in response to an electric current. The emissive layer of organic compound is sandwiched between two electrodes. Organic EL is applied in flat panel displays due to their high illumination, low weight, ultra-thin profile, self-illumination without back light, low power consumption, wide viewing angle, high contrast, simple fabrication methods and rapid response time.

The first observation of electroluminescence in organic materials were in the early 1950s by Andre Bernanose and co-workers at the Nancy-University in France. Martin Pope and his co-workers at New York University first observed direct current (DC) electroluminescence on a single pure crystal of anthracene and on anthracene crystals doped with tetracene under vacuum in 1963.

The first diode device was reported by Ching W. Tang and Steven Van Slyke at Eastman Kodak in 1987. The device used a two-layer structure with separate hole transporting and electron transporting layers resulted in reduction in operating voltage and improvement of the efficiency, that led to the current era of organic EL research and device production.

Typically organic EL device is composed of layers of organic materials situated between two electrodes, which include a hole transporting layer (HTL), an emitting layer (EML), an electron transporting layer (ETL). The basic mechanism of organic EL involves the injection of the carrier, transport, recombination of carriers and exciton formed to emit light. When an external voltage is applied to an organic EL device, electrons and holes are injected from a cathode and an anode, respectively, electrons will be injected from a cathode into a LUMO (lowest unoccupied molecular orbital) and holes will be injected from an anode into a HOMO (highest occupied molecular orbital). When the electrons recombine with holes in the emitting layer, excitons are formed and then emit light. When luminescent molecules absorb energy to achieve an excited state, an exciton may either be in a singlet state or a triplet state depending on how the spins of the electron and hole have been combined. 75% of the excitons form by recombination of electrons and holes to achieve a triplet excited state. Decay from triplet states is spin forbidden, Thus, a fluorescence electroluminescent device has only 25% internal quantum efficiency. In contrast to fluorescence electroluminescent device, phosphorescent organic EL device make use of spin-orbit interactions to facilitate intersystem crossing between singlet and triplet states, thus obtaining emission from both singlet and triplet states and the internal quantum efficiency of electroluminescent devices from 25% to 100%. The spin-orbit interactions is finished by some heavy atom such as iridium, rhodium, platinum, palladium and the phosphorescent transition may be observed from an excited MLCT (metal to ligand charge transfer) state of organic metallic complexes.

The organic EL utilizes both triplet and singlet excitons. Cause of longer lifetime and the diffusion length of triplet excitons compared to those of singlet excitons, the phosphorescent organic EL generally need an additional hole blocking layer (HBL) between the emitting layer (EML) and the electron transporting layer (ETL) or electron blocking layer (EBL) between the emitting layer (EML) and the hole transporting layer (HTL). The purpose of the use of HBL or EBL is to confine the recombination of injected holes and electrons and the relaxation of created excitons within the EML, hence the device's efficiency can be improved. To meet such roles, the hole blocking materials or electron blocking materials must have HOMO (highest occupied molecular orbital) and LUMO (lowest unoccupied molecular orbital) energy levels suitable to block hole or electron transport from the EML to the ETL or the HTL.

For full-colored flat panel displays in AMOLED or OLED lighting panel the material used for the phosphorescent dopant for emitting layer are still unsatisfactory in half-lifetime, efficiency and driving voltage. These organic metallic complexes still have disadvantages for industrial practice use. The phosphorescent dopant with preferential in-plane (horizontal) emitting dipoles are beneficial to optical out-coupling of OLED, since the ratio of vertical emitting dipoles contributing little to external emission is reduced and the radiation pattern of a horizontal emitting dipole is in general more suitable for optical out-coupling. Therefore, an emitter with proper substituents can be helpful to enhance the ratio of horizontal emitting dipole in the emission layer of OLED. Meanwhile, the proper substituents around an emitter can effectively block nearby electrons and holes, so that electrons and holes can easily recombine in the emitter and the efficiency of OLED can be improved.

In the present invention, for the purpose to prolong the half-life time and lower driving voltage for phosphorescent dopant in emitting layer for organic EL device, we employ an paracyclophane skeleton link to the ligand of the iridium complexes, then chelate with one or two bidentate ligand to finish the metallic complexes represented as general formula (1). The paracyclophane-based iridium complexes show good thermal stability and charge carrier mobility for organic EL device. Many prior-arts of iridium complexes such as U.S. Pat. No. 6,835,469B2, U.S. Pat. No. 6,916,554B2, U.S. Pat. No. 7,011,897B2, U.S. Pat. No. 7,429,426B2, U.S. Pat. No. 7,709,100B2, U.S. Pat. No. 7,851,072B2, U.S. Pat. No. 8,269,317B2, U.S. Pat. No. 8,492,006B2, U.S. Pat. No. 8,519,384B2, U.S. Pat. No. 8,557,400B2, U.S. Pat. No. 8,778,508B2 et al. But there are no prior-arts demonstrate an paracyclophane skeleton link to iridium complexes used as phosphorescent dopant of emitting layer for organic EL device.

SUMMARY OF THE INVENTION

According to the reasons described above, the present invention has the objective of resolving such problems of the prior-art and offering a light emitting device which is excellent in its thermal stability, high luminance efficiency, high luminance and long half-life time. The present invention disclose a novel paracyclophane-based iridium complexes having general formula(1), used as a phosphorescent dopant of emitting layer have good charge carrier mobility and excellent operational durability can lower driving voltage and power consumption, increasing efficiency and half-life time of organic EL.

The present invention has the economic advantages for industrial practice. Accordingly, the present invention discloses the paracyclophane-based iridium complexes which can be used for organic EL device is disclosed. The mentioned the paracyclophane-based iridium complexes is represented by the following formula(1):

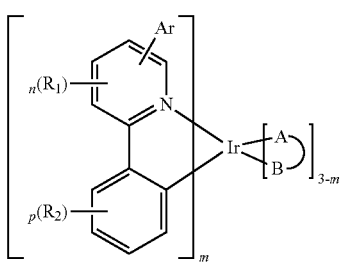

formula(1)

wherein at least one of $R_1$ and $R_2$ represents a substituted or unsubstituted paracyclophane having formula(2):
A-B represents an ancillary ligand, Ar represents a hydrogen atom or a fused carbocyclic ring, m represents an integer of 1 or 2, p represents an integer of 0 to 4, n represents an integer of 0 to 3, $R_1$ to $R_4$ are independently selected from the group consisting of a hydrogen atom, a halide, a deuterium, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, and a substituted or unsubstituted heteroaryl group having 3 to 30 carbon atoms;

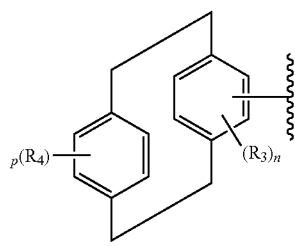

formula(2)

wherein A-B is selected from the group consisting of:

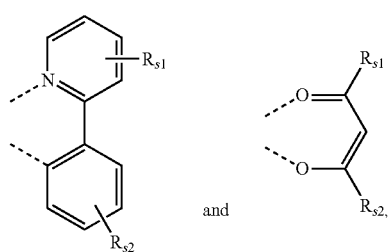

$R_{s1}$ and $R_{s2}$ are substituents representing a hydrogen, a methyl, an isopropyl, an isobutyl, a phenyl, a substituted or unsubstituted alkyl group having 1 to 30 carbon atoms, and a substituted or unsubstituted aryl group having 6 to 30 carbon atoms.

The light emitting layer comprises two or three types of emitting host each independently having one of the following formulas:

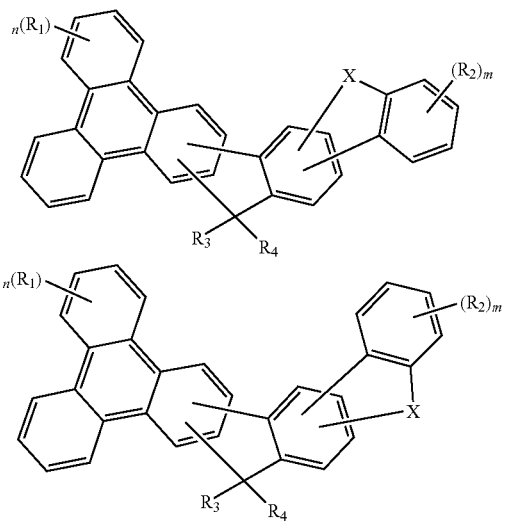

wherein X is a divalent bridge selected from the atom or group consisting from O, S, C($R_8$)$_2$, N($R_9$) and Si($R_{10}$)$_2$, m represents an integer of 0 to 4, n represents an integer of 0 to 8, $R_1$ to $R_4$ and $R_8$ to $R_{10}$ are independently selected from the group consisting of a hydrogen atom, a deuterium, a halide, a substituted or unsubstituted alkyl group having 1 to 20 carbon atoms, a substituted or unsubstituted aryl group having 6 to 30 carbon atoms, and a substituted or unsubstituted heteroaryl group having 3 to 30 carbon atoms.

The light emitting layer comprises two or three types of emitting dopant of the paracyclophane-based iridium complexes with a general formula(1).

BRIEF DESCRIPTION OF THE DRAWINGS

The FIGURE shows one example of organic EL device in the present invention, wherein 6 is transparent electrode, 14 is metal electrode, 7 is hole injection layer which is deposited onto 6, 8 is hole transport layer which is deposited onto 7, 9 is electron blocking layer which is deposited onto 8, 10 is phosphorescent emitting layer which is deposited onto 9, 11 is hole blocking layer which is deposited onto 10, 12 is electron transport layer which is deposited on to 11, and 13 is electron injection layer which is deposited on to 12.

DESCRIPTION OF THE PREFERRED EMBODIMENTS

What probed into the invention is the paracyclophane-based iridium complexes for organic EL device using the paracyclophane-based iridium complexes. Detailed descriptions of the production, structure and elements will be provided in the following to make the invention thoroughly understood. Obviously, the application of the invention is not confined to specific details familiar to those who are skilled in the art. On the other hand, the common elements and procedures that are known to everyone are not described in details to avoid unnecessary limits of the invention. Some preferred embodiments of the present invention will now be described in greater detail in the following. However, it should be recognized that the present invention can be practiced in a wide range of other embodiments besides those explicitly described, that is, this invention can also be applied extensively to other embodiments, and the scope of the present invention is expressly not limited except as specified in the accompanying claims In a first embodiment of the present invention, the paracyclophane-based iridium complexes which can be used as phosphorescent dopant of emitting layer for organic EL device are disclosed. The mentioned the paracyclophane-based iridium complexes represented by the following formula(1):

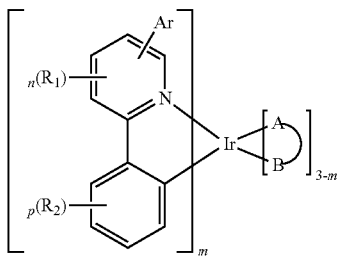

formula(1)

wherein at least one of $R_1$ and $R_2$ represents a substituted or unsubstituted paracyclophane having formula(2):

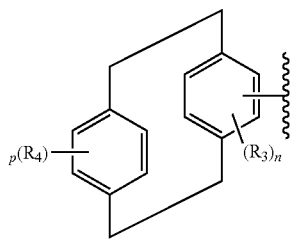

formula(2)

A-B represents an ancillary ligand, Ar represents a hydrogen atom or a fused carbocyclic ring, m represents an integer of 1 or 2, p represents an integer of 0 to 4, n represents an integer of 0 to 3, $R_1$ to $R_4$ are independently selected from the group consisting of a hydrogen atom, a halide, a deuterium, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, and a substituted or unsubstituted heteroaryl group having 3 to 30 carbon atoms;
wherein A-B is selected from the group consisting of:

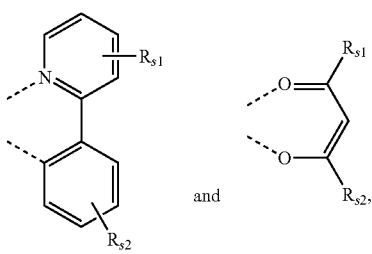

$R_{s1}$ and $R_{s2}$ are substituents representing a hydrogen, a methyl, an isopropyl, an isobutyl, a phenyl, a substituted or unsubstituted alkyl group having 1 to 30 carbon atoms, and a substituted or unsubstituted aryl group having 6 to 30 carbon atoms.

According to the above-mentioned the paracyclophane-based iridium complexes formula(1) represented by the following formula(3) to formula(6):

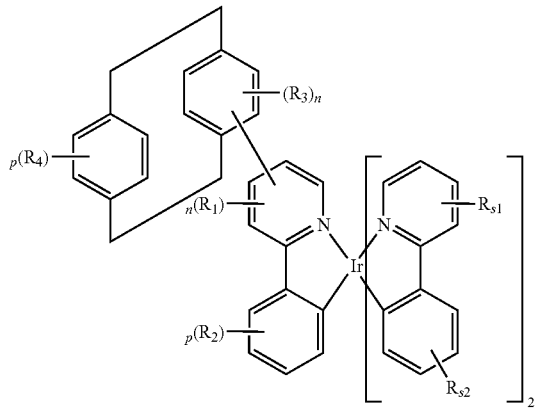

formula(3)

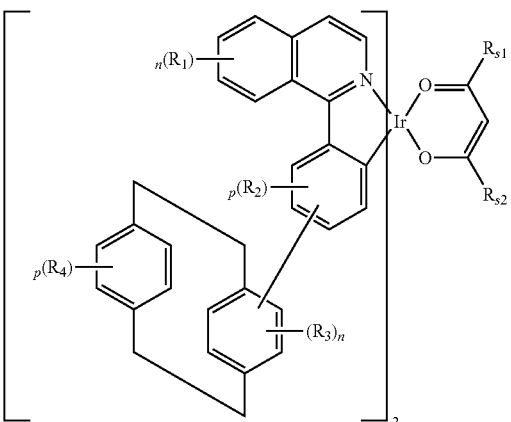

formula(4)

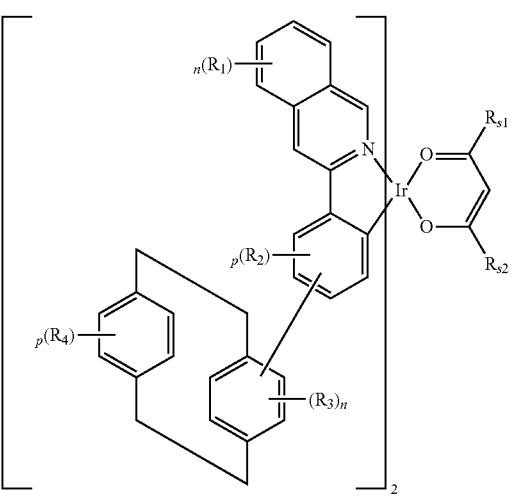

formula(5)

formula(6)

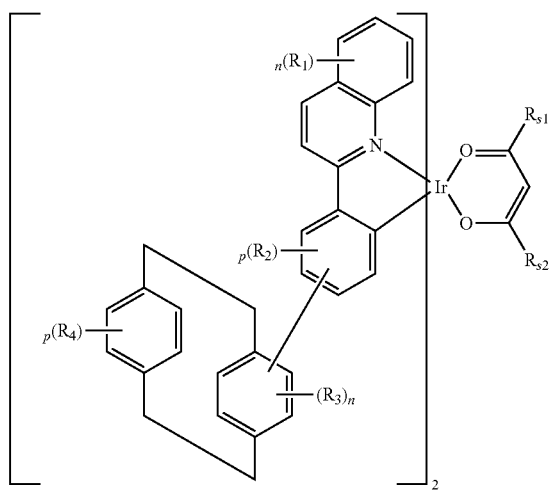

wherein p represents an integer of 0 to 4, n represents an integer of 0 to 3, $R_1$ to $R_4$ are independently selected from the group consisting of a hydrogen atom, a halide, a deuterium, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, and a substituted or unsubstituted heteroaryl group having 3 to 30 carbon atoms; $R_{s1}$ and $R_{s2}$ are substituents representing a hydrogen, a methyl, an isopropyl, an isobutyl, a phenyl, a substituted or unsubstituted alkyl group having 1 to 30 carbon atoms, and a substituted or unsubstituted aryl group having 6 to 30 carbon atoms.

In this embodiment, some paracyclophane-based iridium complexes are shown below:

EX1

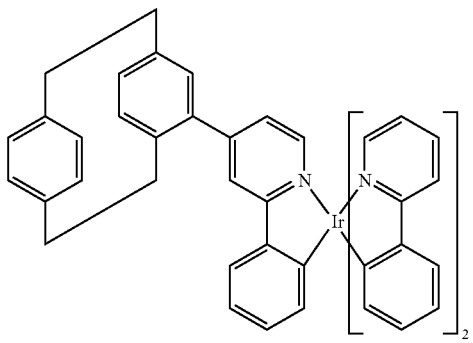

EX2

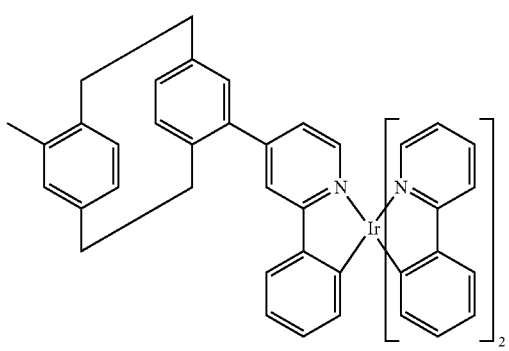

EX3

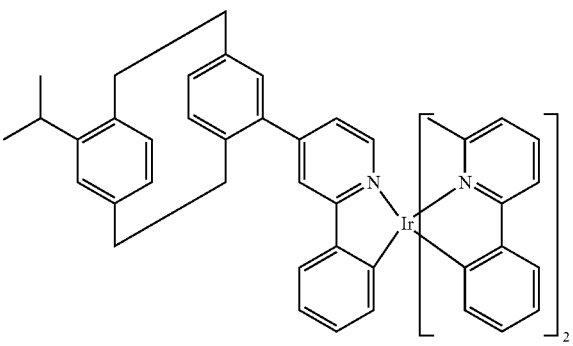

EX4

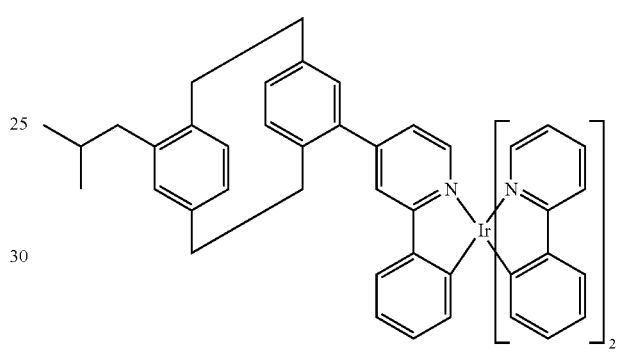

EX5

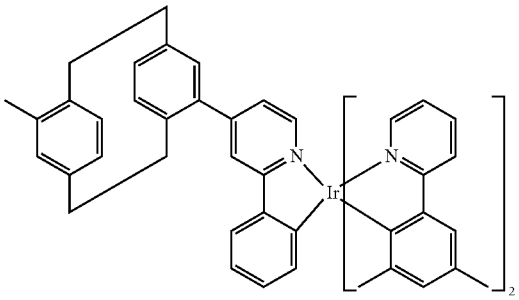

EX6

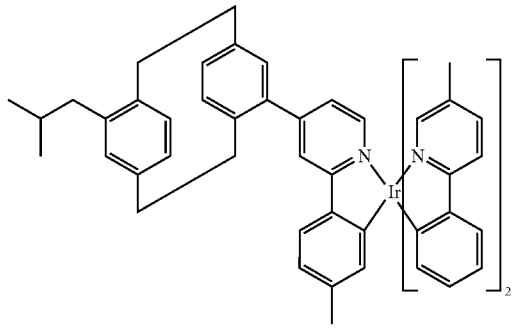

EX7
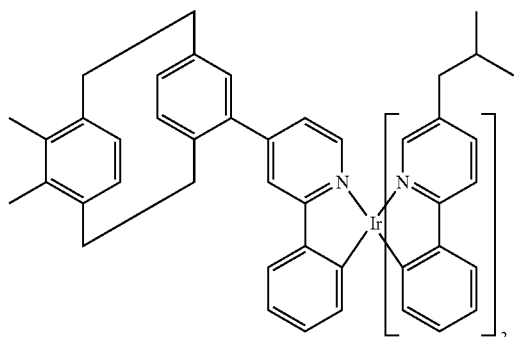
EX10
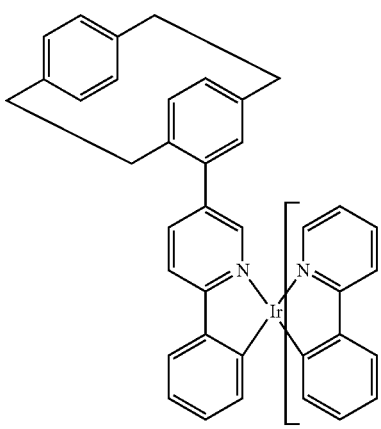
EX8
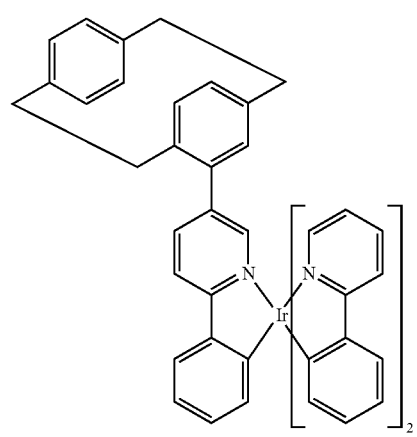
EX11
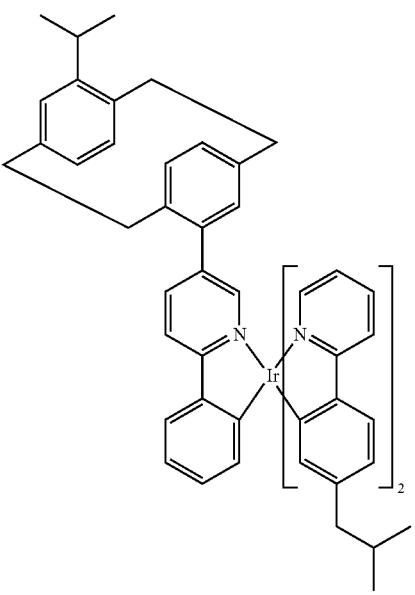
EX9
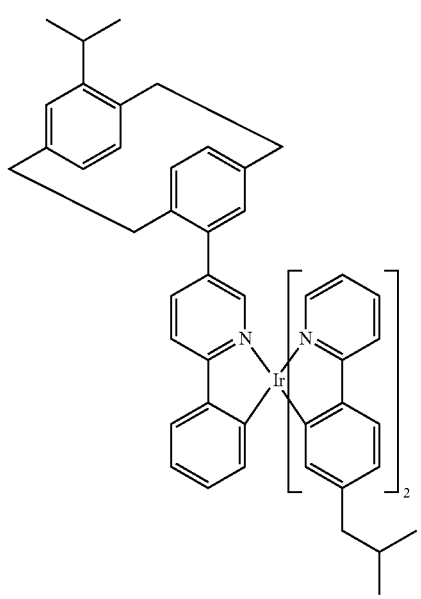
EX12
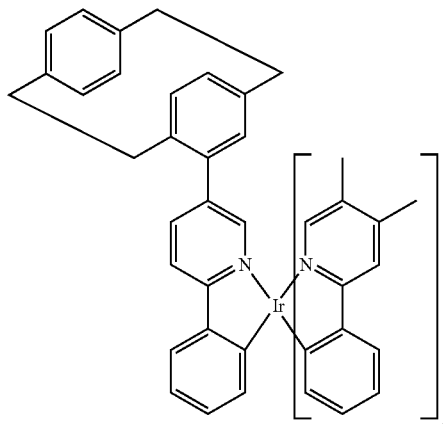

EX13
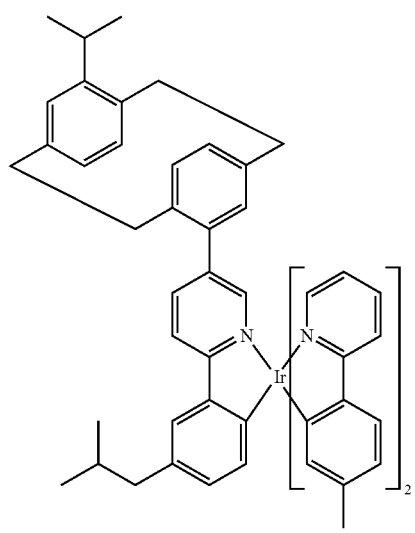
EX14
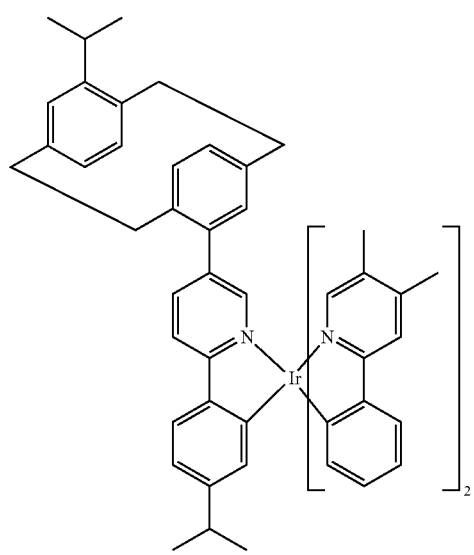
EX15
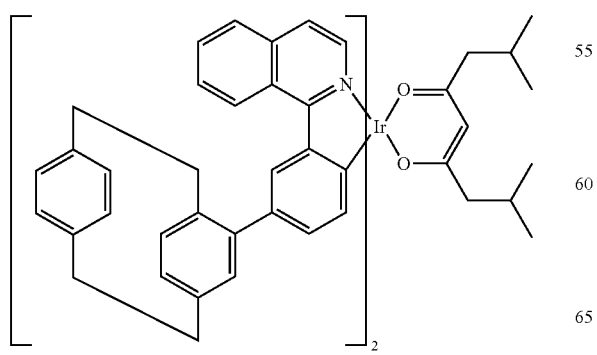
EX16
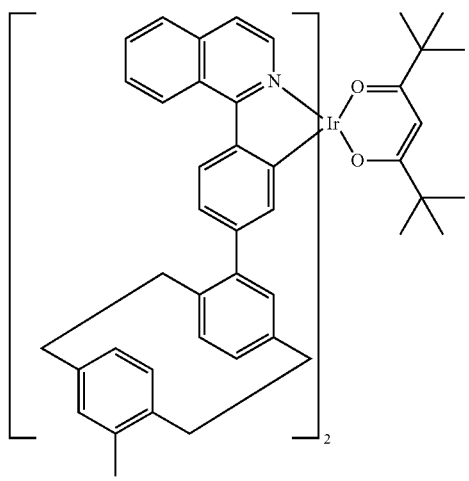
EX17
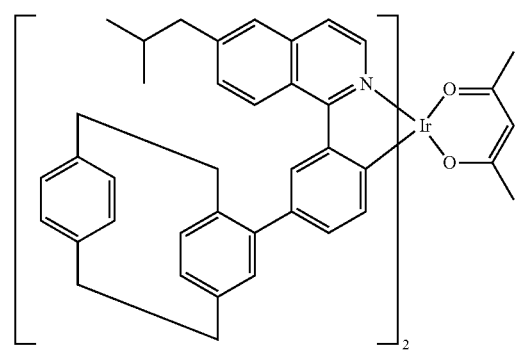
EX18
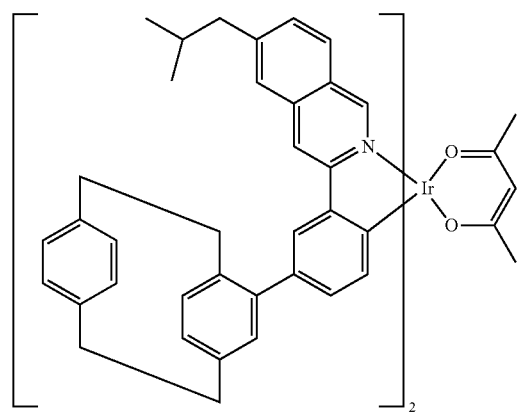

EX19

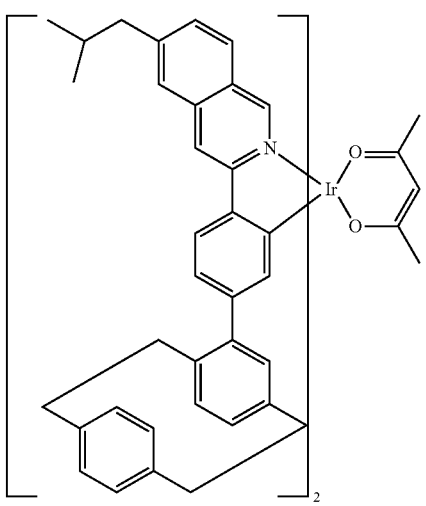

EX20

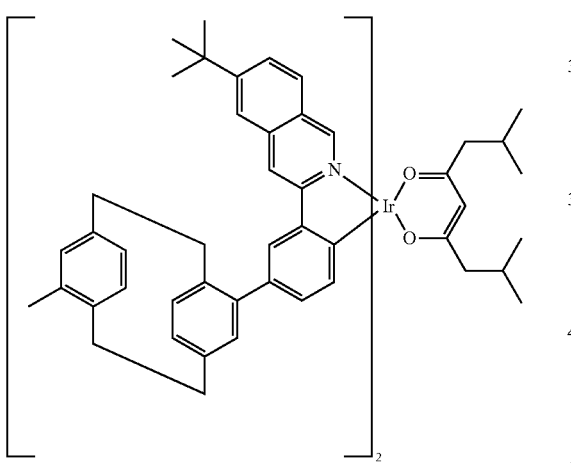

EX21

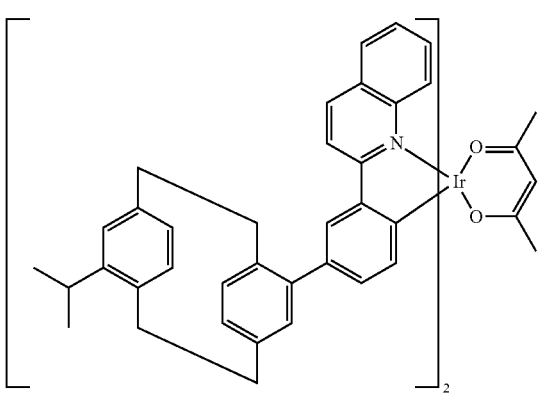

EX22

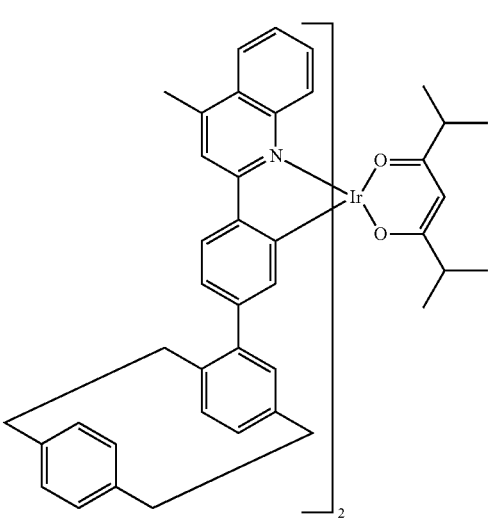

Detailed preparation for the paracyclophane-based iridium complexes in the present invention could be clarified by exemplary embodiments, but the present invention is not limited to exemplary embodiments. EXAMPLE 1 and EXAMPLE 3 show the preparation for examples of the derivative in the present invention. EXAMPLE 4 shows the fabrication of organic EL device and I—V—B, life time ($T_{70}$) of organic EL device testing report.

Example 1

Synthesis of EX1

Synthesis of dichloro-Bridged Dimer

A mixture of 7.35 g (20 mmol) of iridium(III)chloride, 13 g (85 mmol) of 2-phenylpyridine, 1.20 ml of 2-methoxyethanol and 30 ml of distilled water were placed under nitrogen, and then heated reflux overnight. After finishing the reaction, the mixture was allowed to cool to room temperature. The yellow precipitate formed was vacuum filtered and washed with ethanol and hexanes. The dichloro-bridged dimer was dried in a vacuum oven to give 10 g of dimer. The product was not purified any further but used directly in the next step.

Synthesis of iridium triflate Precursor

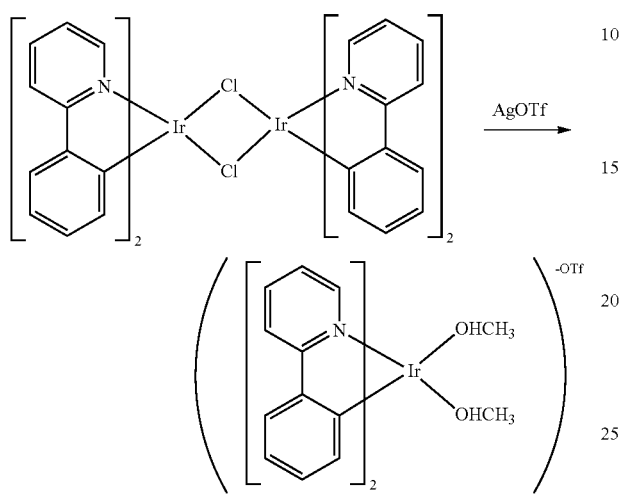

A mixture of 9.6 g of dichloro-bridged dimer, 4.6 g (17.5 mmol) of silver triflate, 300 ml of dichloromethane and 5 ml of methanol were placed under nitrogen, and then stirred overnight. After finishing the reaction, the silver chloride was filtered off. The solvent was evaporated. 10 g of iridium triflate precursor was obtained. The product was not purified any further but used directly in the next step.

Synthesis of 4-bromo-2-phenylpyridine

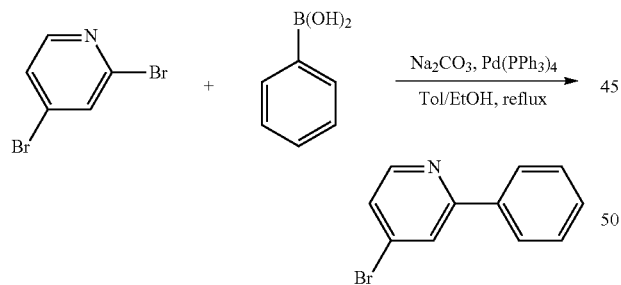

A mixture of 14.2 (60 mmol) of 2,4-dibromopyridine, 7.3 g (60 mmol) of pyridin-2-ylboronic acid, 1.1 (1 mmol) of tetrakis(triphenyl phosphine)palladium, 120 ml of 2M $Na_2CO_3$, 160 ml of EtOH and 250 ml toluene were degassed and placed under nitrogen, and then heated at 90° C. overnight. After finishing the reaction, the mixture was allowed to cool to room temperature. The solution was extracted with 250 ml of ethyl acetate and 1000 ml of water. The organic layer was dried with anhydrous magnesium sulfate and the solvent was evaporated under reduced pressure. The residue was purified by column chromatography on silica gel (Hexane~EA) to give product 8.2 g (35.4 mmol, 59%).

Synthesis of 2-phenyl-4-(4,4,5,5-tetramethyl-1,3, dioxaborolan-2-yl)pyridine

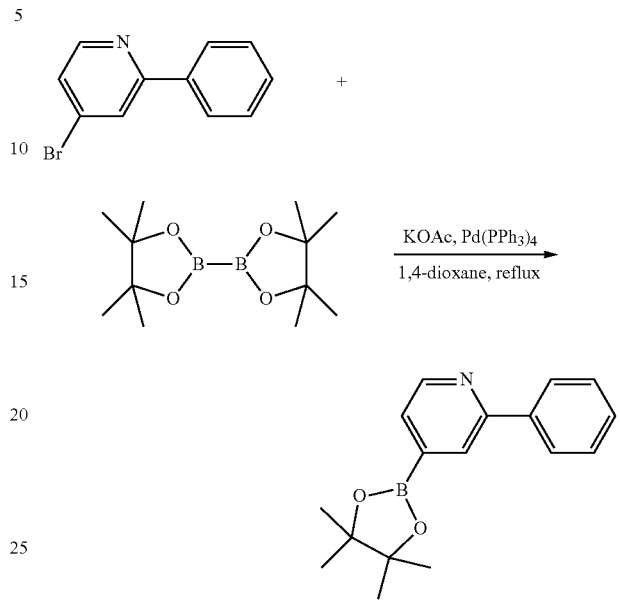

A mixture of 5.9 g (25.3 mmol) of 4-bromo-2-phenylpyridine, 7.7 g (30.3 mmol) of bis(pinacolato)diboron, 0.3 g (0.26 mmol) of $Pd(PPh_3)_4$, 7.4 g (75.4 mmol) of potassium acetate, and 300 ml 1,4-dioxane was degassed and placed under nitrogen, and then heated at 90° C. for 16 h. After finishing the reaction, the mixture was allowed to cool to room temperature. The organic phase separated and washed with ethyl acetate and water. After drying over magnesium sulfate, the solvent was removed in vacuum. The residue was purified by column chromatography on silica gel (hexane-dichloromethane) to give product (4.8 g, 17.2 mmol, 68%) as a light-yellow solid.

Synthesis of Intermediate V

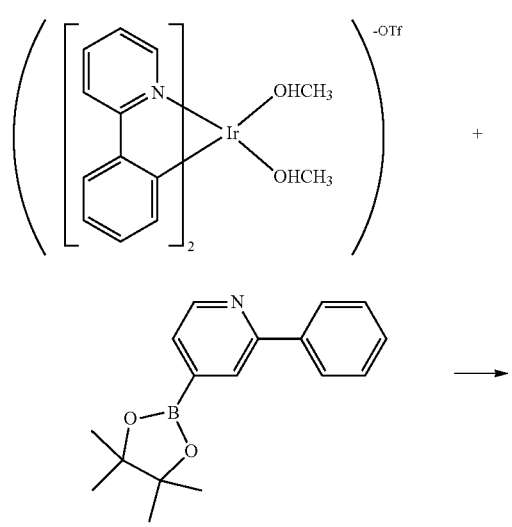

-continued

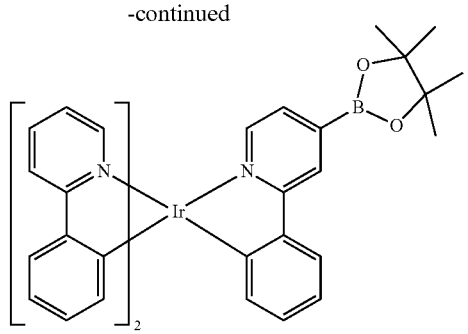

intermediate V

A mixture of 4.8 g (6 mmol) of iridium triflate precursor, 3.4 g (12.1 mmol) of 2-phenyl-4-(4,4,5,5-tetramethyl-1,3,2-dioxaborolan-2-yl) pyridine, 60 ml of EtOH and 15 ml of MeOH were placed under nitrogen, and then heated reflux overnight. After finishing the reaction, the mixture was allowed to cool to room temperature. The yellow precipitate formed was vacuum filtered and washed with ethanol and hexanes to give 3.6 g of yellow product, the product was not purified any further but used directly in the next step.

Synthesis of EX1

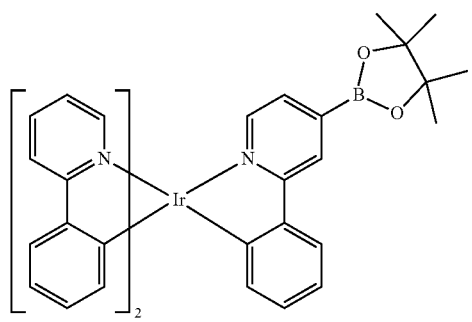

intermediate V

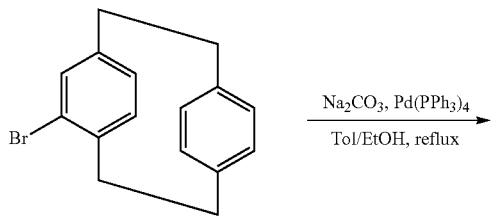

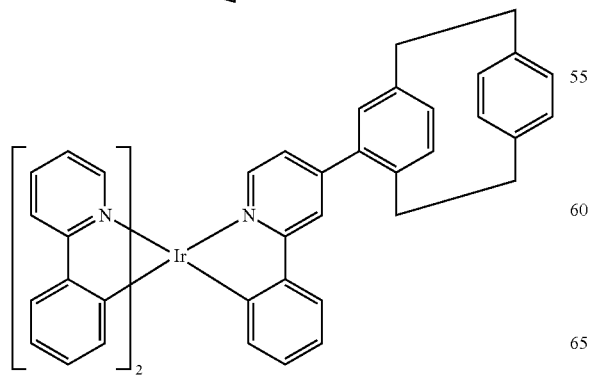

A mixture of 1.9 g (2.5 mmol) of intermediate V, 0.9 g (3 mmol) of 4-bromo[2.2]paracyclophane, 0.231 g (0.2 mmol) of Pd(PPh$_3$)$_4$, 10 ml of 2M Na$_2$CO$_3$, 15 ml of EtOH and 50 ml toluene were degassed and placed under nitrogen, and then heated at 120° C. for 36 h. After finishing the reaction, the mixture was allowed to cool to room temperature. The yellow precipitate formed was vacuum filtered and washed with ethanol and hexanes, the product was purified by vacuum sublimation to give 0.8 g of yellow product. MS (m/z, FAB$^+$):861.5; 1 HNMR (CDCl$_3$, 500 MHz): chemical shift (ppm) 8.24~8.21 (m, 4H), 8.13 (s, 1H), 7.76~7.40 (m, 11H), 7.21~7.20 (m, 3H), 7.04~6.76 (m, 8H), 6.64~6.56 (m, 3H), 3.01~2.97 (m, 8H).

Example 2

Synthesis of EX12

Synthesis of dichloro-Bridged Dimer

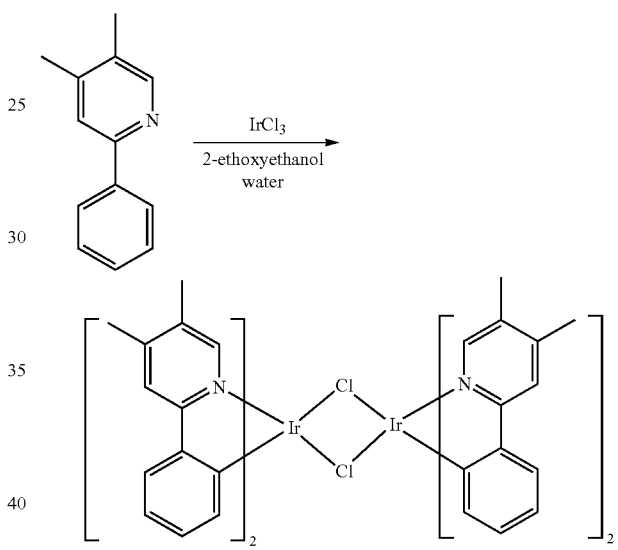

A mixture of 7.35 g (20 mmol) of iridium(III) chloride, 15.7 g (85 mmol) of 4,5-dimethyl-2-phenylpyridine, 120 ml of 2-methoxyethanol and 30 ml of distilled water were was placed under nitrogen, and then heated reflux overnight. After finishing the reaction, the mixture was allowed to cool to room temperature. The yellow precipitate formed was vacuum filtered and washed with ethanol and hexanes. The dichloro-bridged dimer was dried in a vacuum oven to give 10 g. The product was not purified any further but used directly in the next step.

Synthesis of iridium triflate Precursor

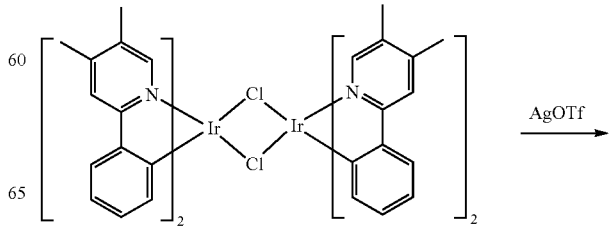

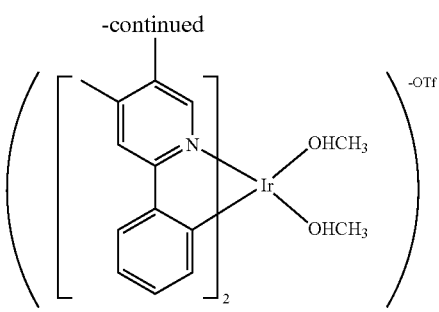

A mixture of 10 g of dichloro-bridged dimer, 4.6 g (17.5 mmol) of silvertriflate, 300 ml of dichloromethane and 5 ml of methanol, was placed under nitrogen, and then stirred overnight. After finishing the reaction, the silver chloride was filtered off. The solvent was evaporated. 10 g of product was obtained. The product was not purified any further but used directly in the next step.

Synthesis of 5-bromo-2-phenylpyridine

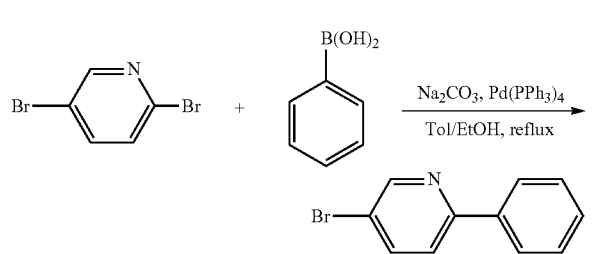

A mixture of 14.2 (60 mmol) of 2,5-dibromopyridine, 7.3 g (60 mmol) of pyridin-2-ylboronic acid, 1.1 (1 mmol) of tetrakis(triphenyl phosphine) palladium, 120 ml of 2M $Na_2CO_3$, 160 ml of EtOH and 250 ml toluene was degassed and placed under nitrogen, and then heated at 90° C. overnight. After finishing the reaction, the mixture was allowed to cool to room temperature. The solution was extracted with 250 ml of ethyl acetate and 1000 ml of water. The organic layer was dried with anhydrous magnesium sulfate and the solvent was evaporated under reduced pressure. The residue was purified by column chromatography on silica gel (Hexane~EA) to give product 7.4 g (31.8 mmol, 53%).

Synthesis of 2-phenyl-5-(4,4,5,5-tetramethyl-1,3, dioxaborolan-2-yl)pyridine

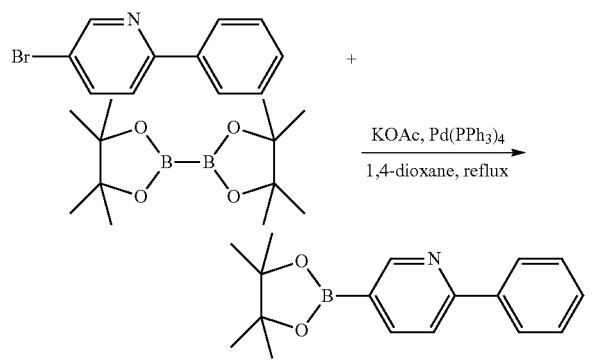

A mixture of 5.9 g (25.3 mmol) of 5-bromo-2-phenylpyridine, 7.7 g (30.3 mmol) of bis(pinacolato)diboron, 0.3 g (0.26 mmol) of $Pd(PPh_3)_4$, 7.4 g (75.4 mmol) of potassium acetate, and 300 ml 1,4-dioxane was degassed and placed under nitrogen, and then heated at 90° C. for 16 h. After finishing the reaction, the mixture was allowed to cool to room temperature. The organic phase separated and washed with ethyl acetate and water. After drying over magnesium sulfate, the solvent was removed in vacuum. The residue was purified by column chromatography on silicagel (hexane-dichloromethane) to give product (9.5 g, 20.2 mmol, 80%) as a light-yellow solid.

Synthesis of Intermediate I

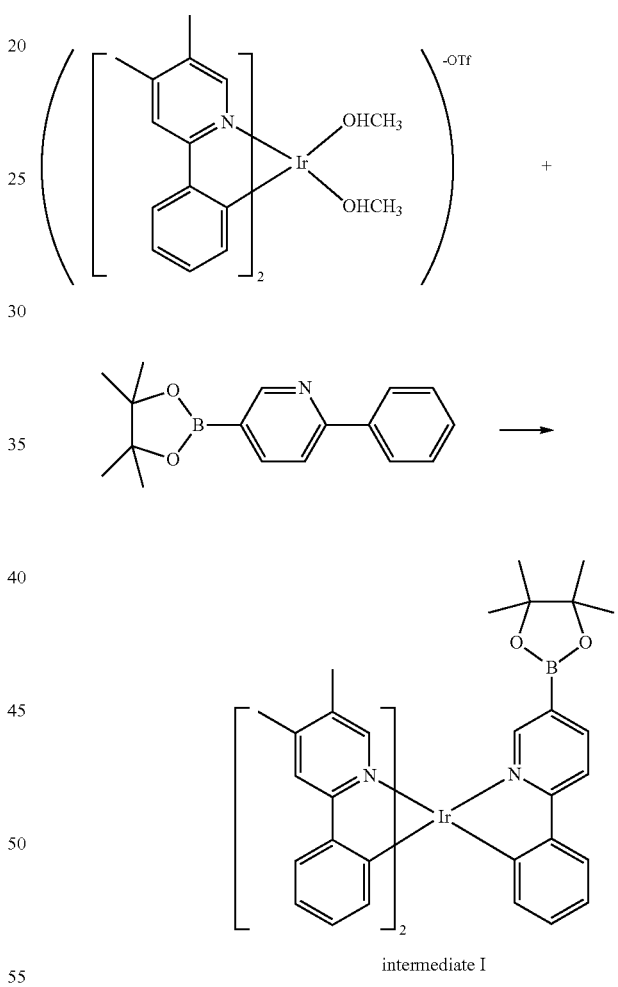

intermediate I

A mixture of 5.1 g (6 mmol) of iridium triflate precursor, 3.4 g (12.1 mmol) of 2-phenyl-5-(4,4,5,5-tetramethyl-1,3,2-dioxaborolan-2-yl) pyridine, 60 ml of EtOH and 15 ml of MeOH were was placed under nitrogen, and then heated reflux overnight. After finishing the reaction, the mixture was allowed to cool to room temperature. The yellow precipitate formed was vacuum filtered and washed with ethanol and hexanes, to give 2.1 g of yellow product, the product was not purified any further but used directly in the next step.

Synthesis of EX12

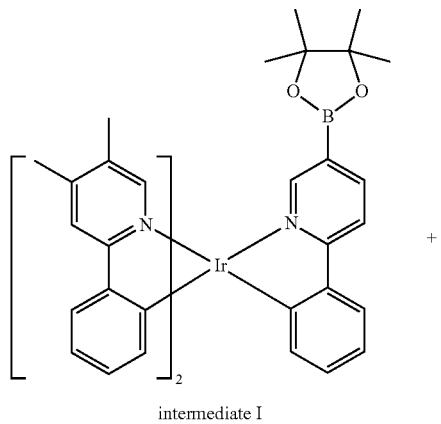

intermediate I

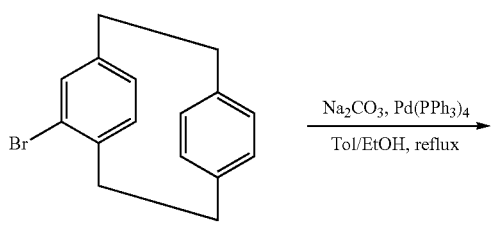

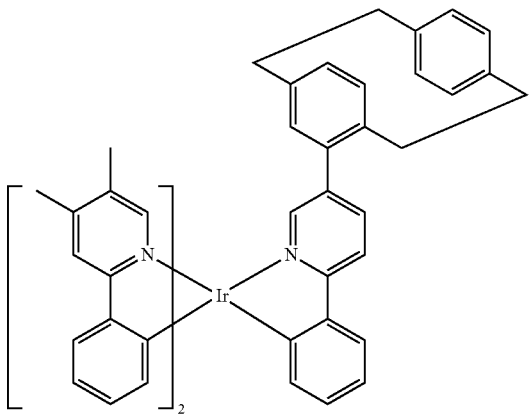

A mixture of 2.1 g (2.5 mmol) of intermediate I, 0.9 g (3 mmol) of 4-bromo[2.2]paracyclophane, 0.231 g (0.2 mmol) of Pd(PPh$_3$)$_4$, 10 ml of 2M Na$_2$CO$_3$, 15 ml of EtOH and 50 ml toluene were degassed and placed under nitrogen, and then heated at 120° C. for 36 h. After finishing the reaction, the mixture was allowed to cool to room temperature. The yellow precipitate formed was vacuum filtered and washed with ethanol and hexanes, the product was purified by vacuum sublimation to give 0.8 g of yellow product. MS (m/z, FAB$^+$):917.5; 1 H NMR (CDCl$_3$, 500 MHz): chemical shift (ppm) 8.03 (s, 1H), 7.76~7.40 (m, 11H), 7.21~7.20 (m, 3H), 7.04~6.76 (m, 8H), 6.64~6.56 (m, 3H), 3.02~3.00 (m, 8H), 2.31 (s, 6H), 2.03 (s, 6H).

Example 3

Synthesis of EX19

Synthesis of Intermediate II

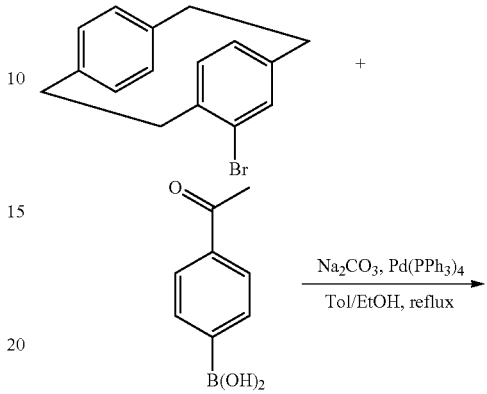

intermediate II

A mixture of 28.7 g (100 mmol) of 4-bromo[2.2]paracyclophane, 18.0 g (110 mmol) of 4-acetylphenylboronic acid, 1.16 g (1 mmol) of tetrakis (triphenylphosphine)palladium, 50 ml of 2M Na$_2$CO$_3$, 50 ml of EtOH and 150 ml toluene was degassed and placed under nitrogen, and then heated at 90° C. overnight. After finishing the reaction, the mixture was allowed to cool to room temperature. Than 500 ml of MeOH was added, while stirring and the precipitated product was filtered off with suction. To give 22.2 g (68 mmol yield 68%) of yellow product which was recrystallized from toluene.

Synthesis of (2-amino-6-chlorophenyl)methanol

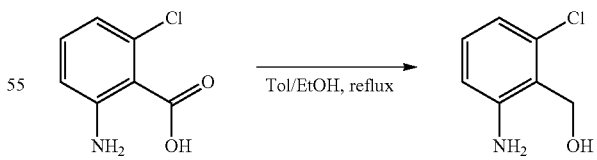

A mixture of 50.0 g (286 mmol) of 2-Amino-6-chlorobenzoic acid was dissolved in 300 ml of anhydrous THF, The solution was cooled to 0~10° C., 450 ml of 1.0 M lithium aluminum hydride THF solution was added, the reaction mixture was allowed to warm up to room temperature and then stirred at room temperature overnight, 10% NaOH aqueous solution 300 ml was added to the reaction mixture, the organic phase separated and washed with ethyl acetate and water. After drying over magnesium sulfate, the solvent

Synthesis of Intermediate III

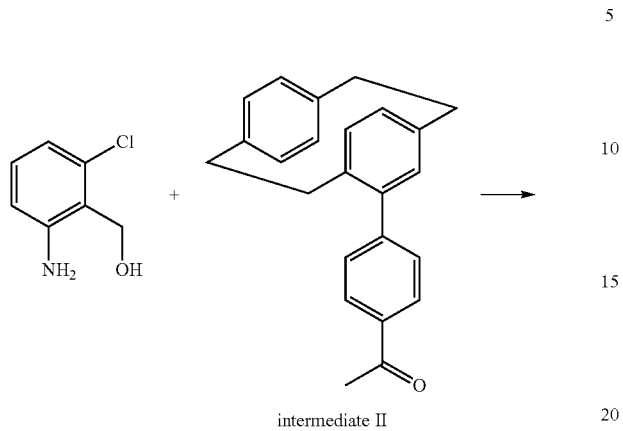

A mixture of 16.0 g (120 mmol) of (2-Amino-6-chlorophenyl) methanol, 22.2 g (68 mmol) of intermediate II, 1.0 g of RuCl$_2$(PPh$_3$)$_3$ (1.0 mmol), 10.25 g of KOH (183 mmol) and 300 ml of toluene was refluxed overnight. After finishing the reaction the solution was filtered at 110° C. To receive the filtrate, and the toluene was removed under reduced pressure from the filtrate. The filtrate was extracted with 500 ml dichloromethane and 2000 ml water, the organic layer was dried with anhydrous magnesium sulfate, the solvent was removed and the residue was purified by column chromatography on silica gel(hexane-ethyl acetate) to give product 12.4 g (41%).

Synthesis of Intermediate IV

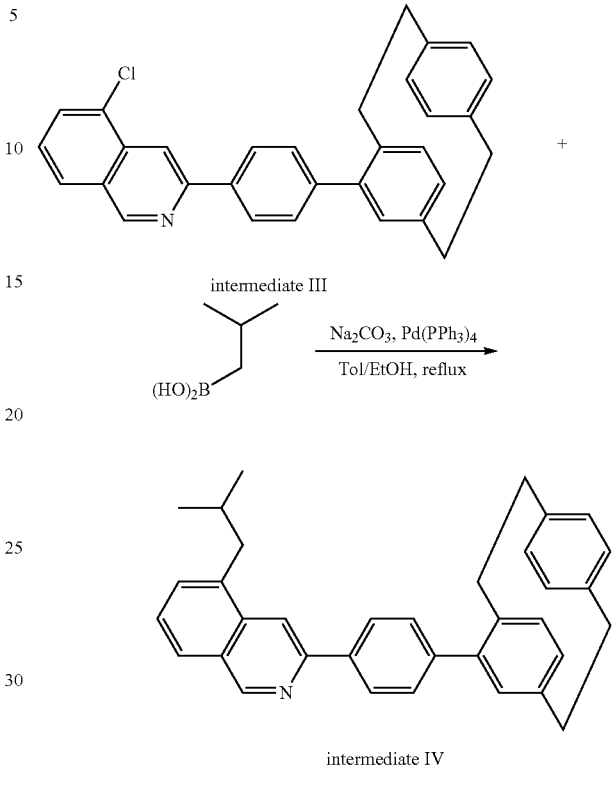

A mixture of 12.4 g (30 mmol) of intermediate III, 4.1 g (40 mmol) of isobutylboronic acid, 0.7 g (0.6 mmol) of Pd(PPh$_3$)$_4$, 30 ml of 2M Na$_2$CO$_3$, 50 ml of EtOH and 100 ml toluene was degassed and placed under nitrogen, and then heated at 120° C. for 24 h. After finishing the reaction, the mixture was allowed to cool to room temperature. The organic layer was extracted with ethyl acetate and water, dried with anhydrous magnesium sulfate, the solvent was removed and the residue was purified by column chromatography on silica gel to give product (10.9 g, 23.4 mmol, 78%) as a solid.

Synthesis of dichloro-Bridged Dimer

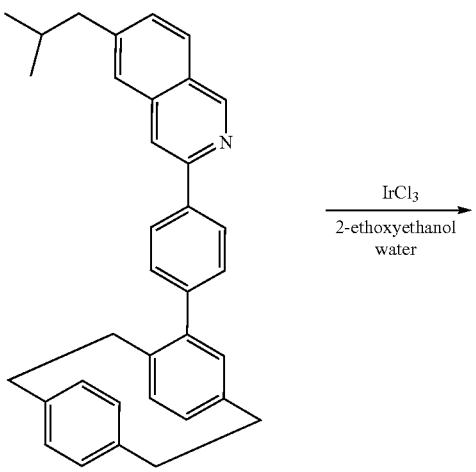

IrCl$_3$
2-ethoxyethanol
water

-continued

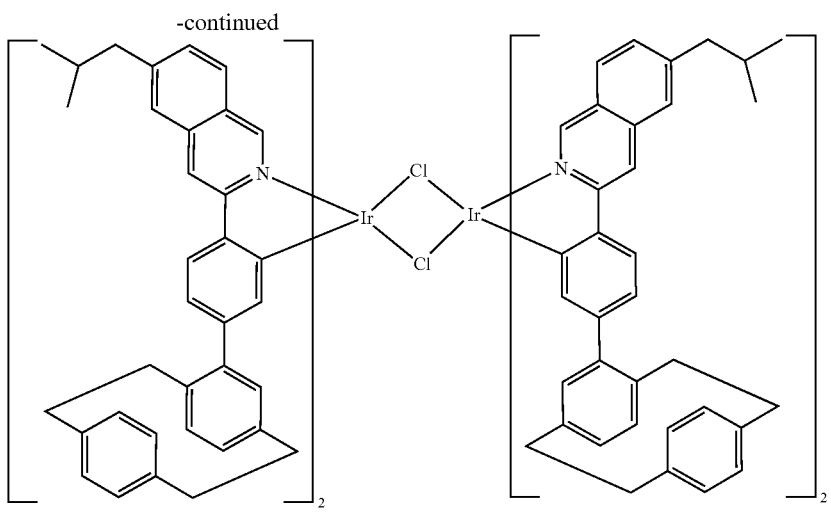

A mixture of 1.84 g (5 mmol) of iridium(II) chloride, 10.9 g (23.4 mmol) of intermediate IV, 40 ml of 2-methoxyethanol and 5 ml of distilled water, was placed under nitrogen, and then heated reflux overnight. After finishing the reaction, the mixture was allowed to cool to room temperature. The red precipitate formed was vacuum filtered and washed with ethanol and hexanes. The dichloro-bridged dimer was dried in a vacuum oven to give 2.4 g. The product was not purified any further but used directly in the next step.

Synthesis of EX19

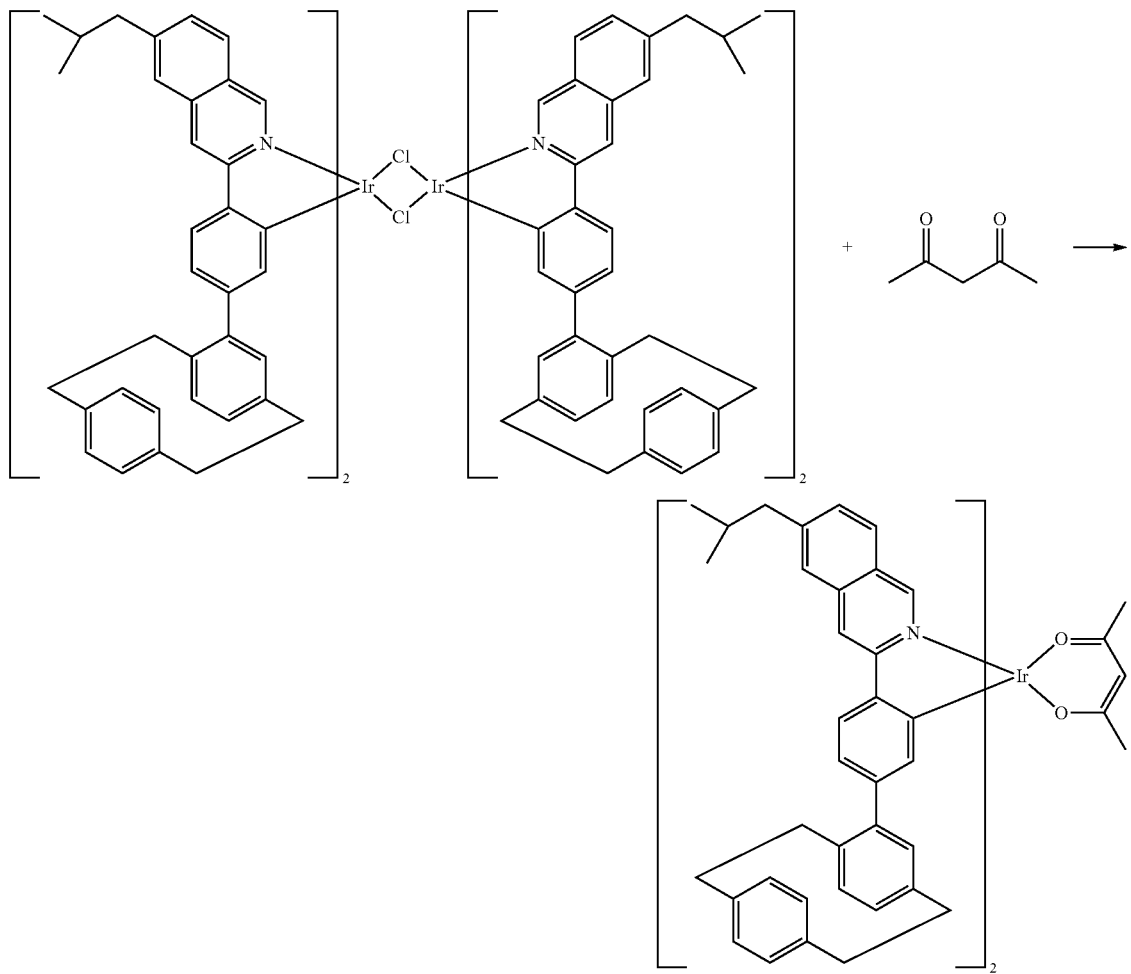

A mixture of 2.4 g of dichloro-bridged dimer, 2.6 g (26.3 mmol) of pentane-2,4-dione, 3.7 g (27 mmol) of K$_2$CO$_3$, and 50 ml of 2-ethoxyethanol were stirred at room temperature for 24 h. The precipitate was filtered and washed with methanol. The solid was further purified by sublimed twice under high vacuum at 310° C. to give 1.3 g of red product. MS (m/z, FAB$^+$):1224.3; 1 H NMR (CDCl$_3$, 500 MHz): chemical shift (ppm) 8.26~8.24 (m, 2H), 8.06~8.04 (m, 2H), 7.76~7.40 (m, 10H), 7.21~7.20 (m, 3H), 7.04~6.76 (m, 4H), 6.64~6.56 (m, 3H), 4.21 (s, 1H), 3.02~3.00 (m, 8H), 2.95~2.84 (m, 4H), 2.31 (s, 6H), 2.00~1.98 (m, 4H), 1.26~1.23 (m, 12H), 0.93~0.91 (m, 12H).

General Method of Producing Organic EL Device

ITO-coated glasses with 9~12 ohm/square in resistance and 120~160 nm in thickness are provided (hereinafter ITO substrate) and cleaned in a number of cleaning steps in an ultrasonic bath (e.g. detergent, deionized water). Before vapor deposition of the organic layers, cleaned ITO substrates are further treated by UV and ozone. All pre-treatment processes for ITO substrate are under clean room (class 100).

These organic layers are applied onto the ITO substrate in order by vapor deposition in a high-vacuum unit (10$^{-7}$ Torr), such as: resistively heated quartz boats. The thickness of the respective layer and the vapor deposition rate (0.1~0.3 nm/sec) are precisely monitored or set with the aid of a quartz-crystal monitor. It is also possible, as described above, for individual layers to consist of more than one compound, i.e. in general a host material doped with a dopant material. This is achieved by co-vaporization from two or more sources.

Dipyrazino[2,3-f:2,3-]quinoxaline-2,3,6,7,10,11-hexacarbonitrile (HAT-CN) is used as hole injection layer in this organic EL device, and N,N-Bis (naphthalene-1-yl)-N,N-bis (phenyl)-benzidine (NPB) is most widely used as the hole transporting layer, N-(biphenyl-4-yl)-9,9-dimethyl-N-(4'-phenylbiphenyl-4-yl)-9H-fluoren-2-amine (EB2) is used as electron blocking layer, and the chemical structure shown below:

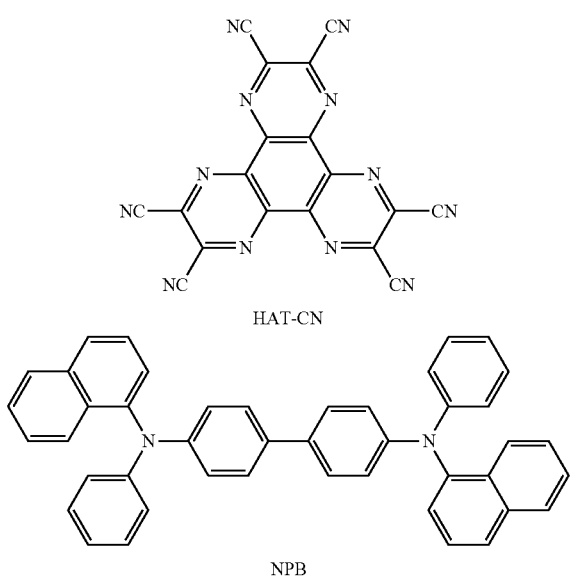

HAT-CN

NPB

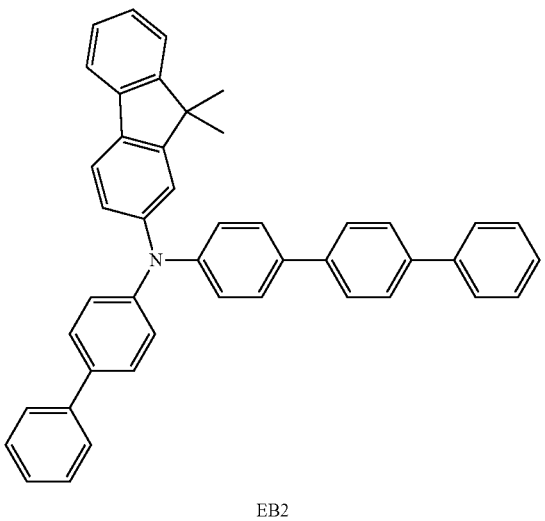

EB2

In the present invention the phosphorescent emitting host used as the following formulas:

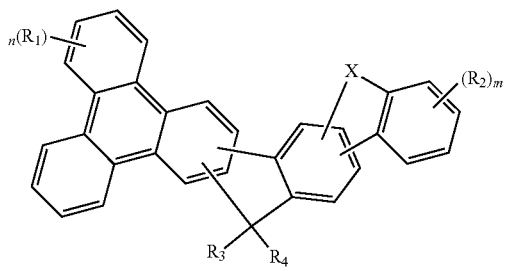

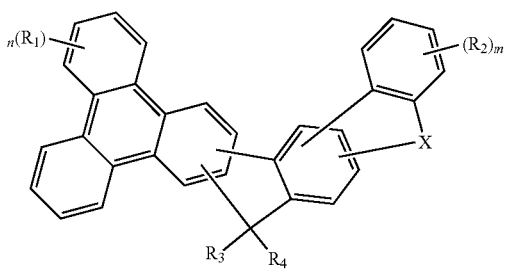

wherein X is a divalent bridge selected from the atom or group consisting from O, S, C(R$_8$)$_2$, N(R$_9$) and Si(R$_{10}$)$_2$, m represents an integer of 0 to 4, n represents an integer of 0 to 8, R$_1$ to R$_4$ and R$_8$ to R$_{10}$ are independently selected from the group consisting of a hydrogen atom, a halide, a substituted or unsubstituted alkyl group having 1 to 20 carbon atoms, a substituted or unsubstituted aryl group having 6 to 30 carbon atoms and a substituted or unsubstituted heteroaryl group having 3 to 30 carbon atoms; wherein the phosphorescent light emitting host is selected from the group consisting of:

H1
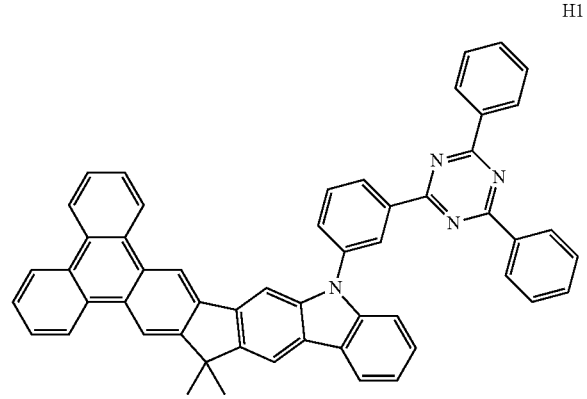
H2
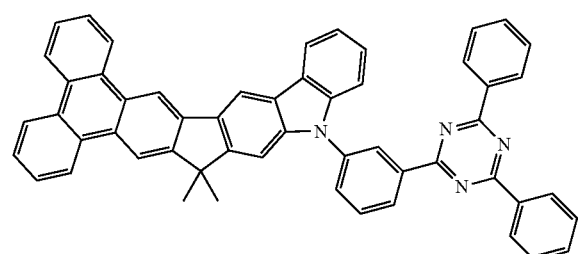
H3
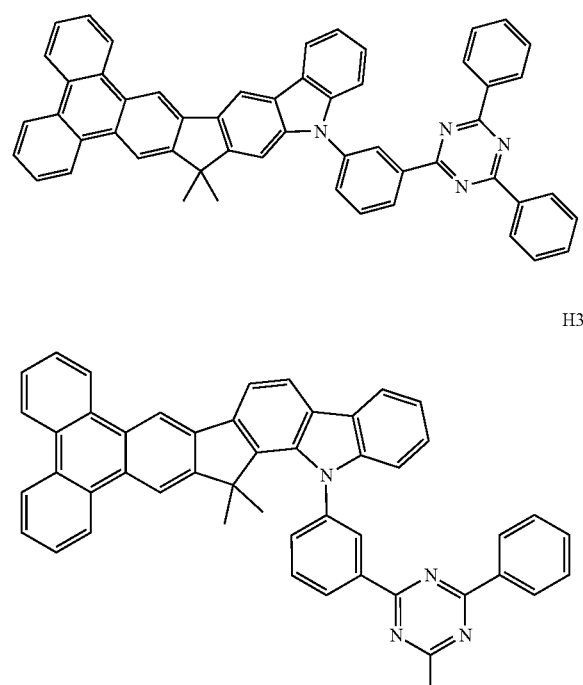
H4
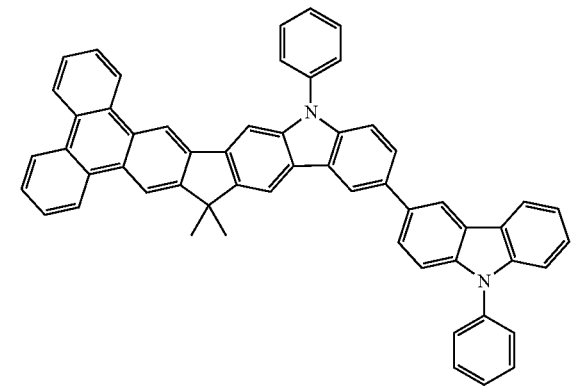
H5
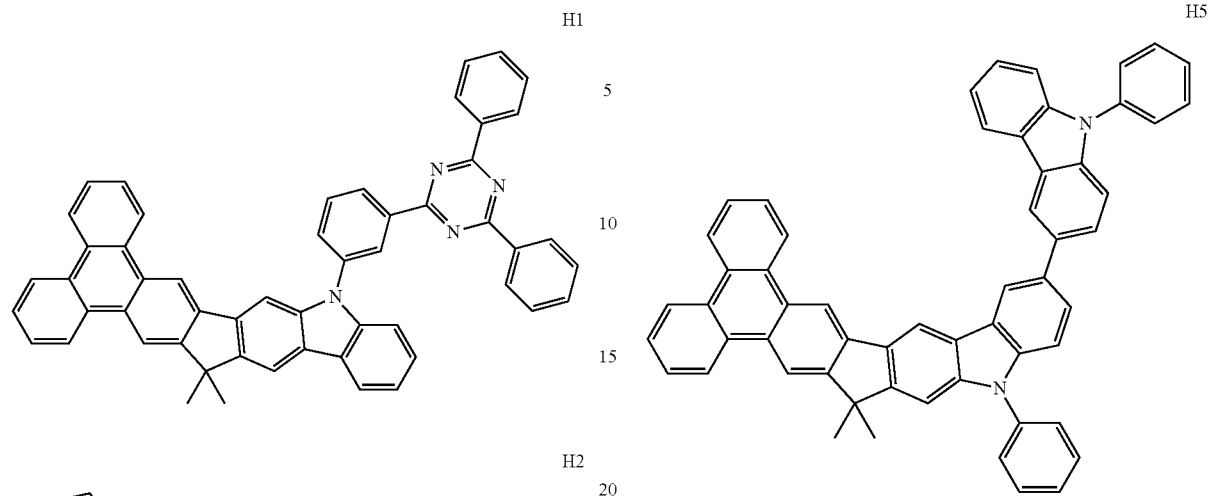
H6
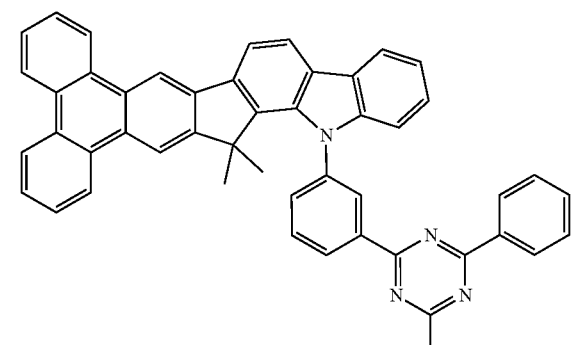
In the present invention another suitable phosphorescent emitting host used to co-deposition with H1 to H3 as the following formulas:
H7
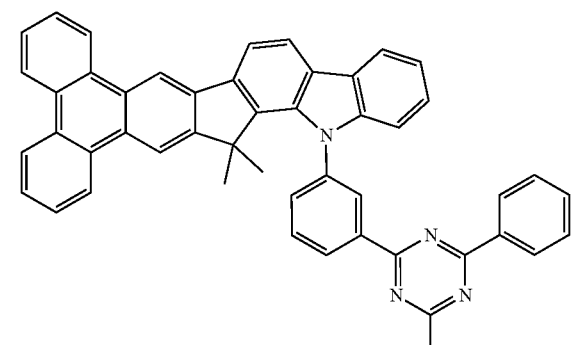
H8
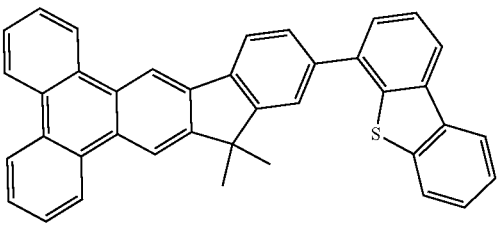
Organic iridium complexes are widely used as phosphorescent dopant for light emitting layer, Ir(ppy)₃, Ir(piq)₂

(acac) and Ir(2-phq)$_2$(acac) are widely used for phosphorescent dopant of light emitting layer for comparable materials in the present invention.

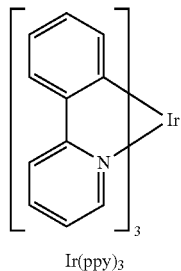
Ir(ppy)$_3$

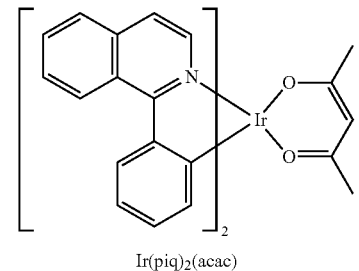
Ir(piq)$_2$(acac)

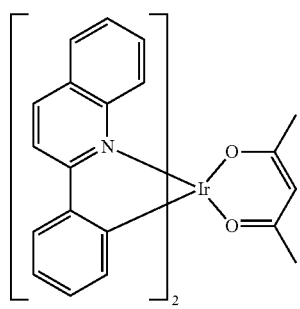
Ir(2-phq)$_2$(acac)

EX1

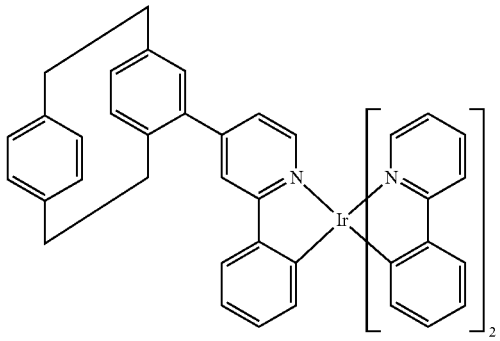

EX12

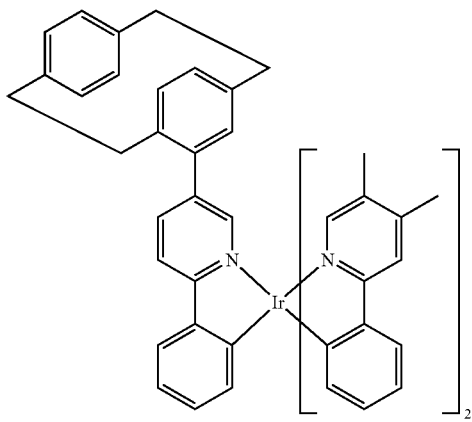

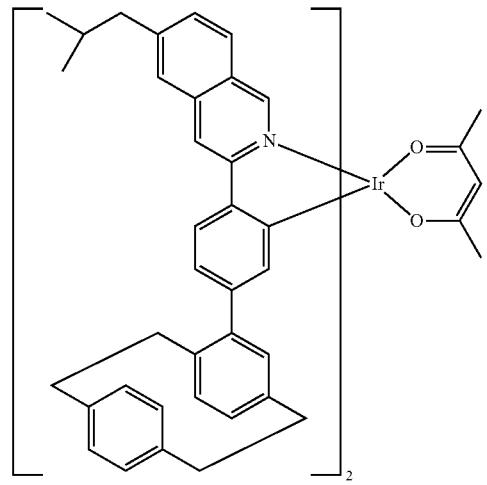

EX19

HB3 (see the following chemical structure) is used as hole blocking material (HBM) and 2-(10,10-dimethyl-10H-indeno[2,1-b]triphenylen-12-yl)-4,6-diphenyl-1,3,5-triazine (ET2) is used as electron transporting material to co-deposit with 8-hydroxyquinolato-lithium (LiQ) in organic EL device. The prior art of other OLED materials for producing standard organic EL device control and comparable material in this invention shown its chemical structure as follows:

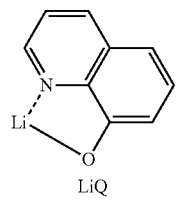
LiQ

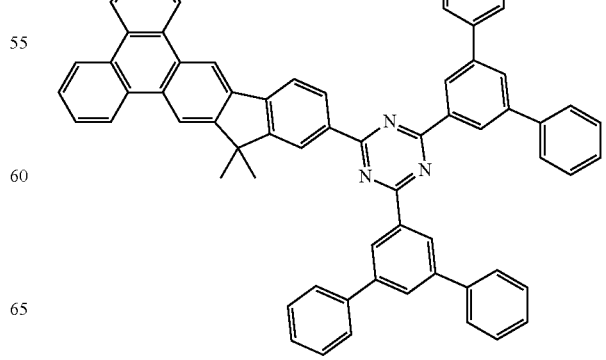
ET2

HB3

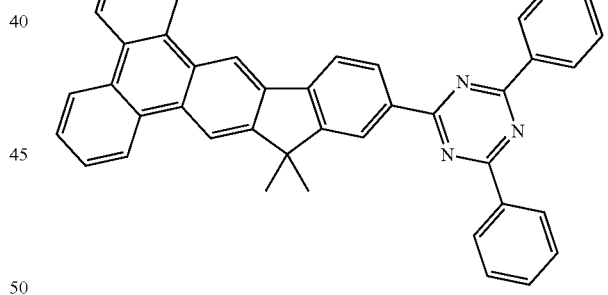

A typical organic EL device consists of low work function metals, such as Al, Mg, Ca, Li and K, as the cathode by thermal evaporation, and the low work function metals can help electrons injecting the electron transporting layer from cathode. In addition, for reducing the electron injection barrier and improving the organic EL device performance, a thin-film electron injecting layer is introduced between the cathode and the electron transporting layer. Conventional materials of electron injecting layer are metal halide or metal oxide with low work function, such as: LiF, LiQ, MgO, or $Li_2O$. On the other hand, after the organic EL device fabrication, EL spectra and CIE coordination are measured by using a PR650 spectra scan spectrometer. Furthermore, the current/voltage, luminescence/voltage and yield/voltage characteristics are taken with a Keithley 2400 programmable voltage-current source. The above-mentioned apparatuses are operated at room temperature (about 25° C.) and under atmospheric pressure.

Example 4

Using a procedure analogous to the above mentioned general method, phosphorescent emitting organic EL device having the following device structure was produced(See the FIGURE). Device: ITO/HAT-CN(20 nm)/NPB (110 nm)/EB2(5 nm)/H1 to H8 doped 12% phosphorescent emitting dopant (30 nm)/HB3(10 nm)/ET2 doped 45% LiQ(35 nm)/LiQ(1 nm)/Al(160 nm). The I-V-B(at 1000 nits) and half-life time of phosphorescent emitting organic EL device testing report as Table 1. The $T_{70}$ is defined that the initial luminance of 3000 cd/m² has dropped to 2100 cd/m².

TABLE 1

| Emitting host | Emitting dopant | Voltage (V) | Efficiency (cd/A) | Color | $T_{70}$ |
|---|---|---|---|---|---|
| H1 | EX1 | 4.0 | 45 | green | 430 |
| H1 | Ir(ppy)₃ | 3.8 | 40 | green | 320 |
| H2 | EX1 | 3.5 | 48 | green | 440 |
| H3 | EX1 | 3.6 | 51 | green | 310 |
| H4 | Ir(ppy)₃ | 3.8 | 30 | green | 220 |
| H5 | EX1 | 4.0 | 30 | green | 250 |
| H6 | EX1 | 3.5 | 18 | green | 150 |
| H7 | EX1 | 3.5 | 32 | green | 330 |
| H8 | EX1 | 3.6 | 35 | green | 350 |
| H3 + H6 | EX1 | 4.2 | 56 | green | 550 |
| H2 + H7 | EX1 | 4.0 | 58 | green | 580 |
| H2 + H8 | EX12 | 3.0 | 52 | yellow | 610 |
| H3 | EX12 | 3.0 | 46 | yellow | 440 |
| H2 + H8 | Ir(2-phq)₂(acac) | 4.5 | 48 | yellow | 350 |
| H2 | EX19 | 3.5 | 18 | red | 320 |
| H2 + H8 | EX19 | 3.8 | 28 | red | 660 |
| H2 + H8 | Ir(piq)₂(acac) | 4.5 | 15 | red | 350 |

In the above preferred embodiments for phosphorescent organic EL device test report (see Table 1), we show that the paracyclophane-based iridium complexes with a general formula(1) used as light emitting dopant of emitting layer for organic EL device in the present invention display good performance than the prior art of organic EL materials. More specifically, the organic EL device in the present invention use the paracyclophane-based iridium complexes with a general formula(1) as light emitting dopant material to collocate with emitting host material H1 to H8 shown lower power consumption, longer half-life time and higher efficiency.

To sum up, the present invention discloses a paracyclophane-based iridium complexes which can be used as light emitting dopant of emitting layer for phosphorescent organic EL device are disclosed. The mentioned the paracyclophane-based iridium complexes represented by the following formula(1):

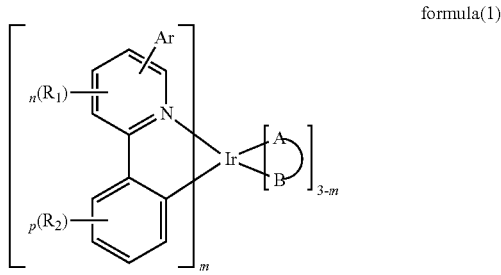

formula(1)

wherein at least one of $R_1$ and $R_2$ represents a substituted or unsubstituted paracyclophane having formula(2):

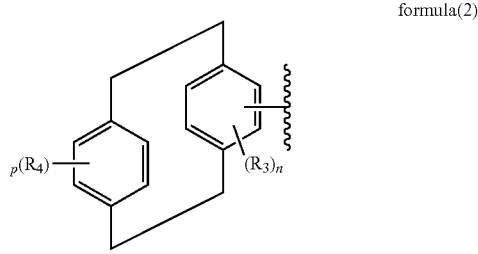

formula(2)

A-B represents an ancillary ligand, Ar represents a hydrogen atom or a fused carbocyclic ring, m represents an integer of 1 or 2, p represents an integer of 0 to 4, n represents an integer of 0 to 3, $R_1$ to $R_4$ are independently selected from the group consisting of a hydrogen atom, a halide, a deuterium, a substituted or unsubstituted alkyl group having 1 to 30 carbon atoms, a substituted or unsubstituted aryl group having 6 to 30 carbon atoms, a substituted or unsubstituted aralkyl group having 6 to 30 carbon atoms, and a substituted or unsubstituted heteroaryl group having 3 to 30 carbon atoms;
wherein A-B is selected from the group consisting of:

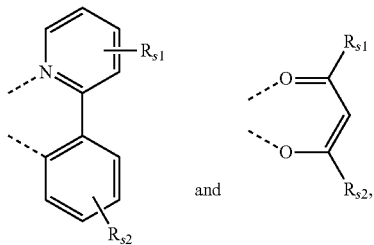

$R_{s1}$ and $R_{s2}$ are substituents representing a hydrogen, a methyl, an isopropyl, an isobutyl, a phenyl, a substituted or unsubstituted alkyl group having 1 to 30 carbon atoms, and a substituted or unsubstituted aryl group having 6 to 30 carbon atoms.

Obvious many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

The invention claimed is:
1. A paracyclophane-based iridium complex selected from the group consisting of:
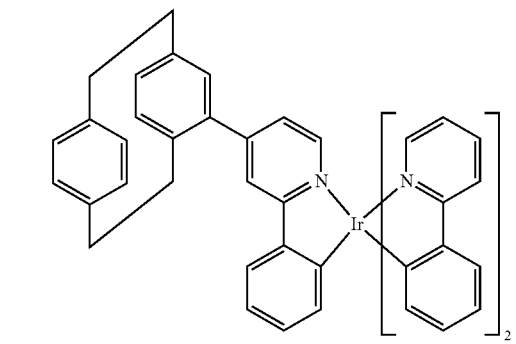
EX1
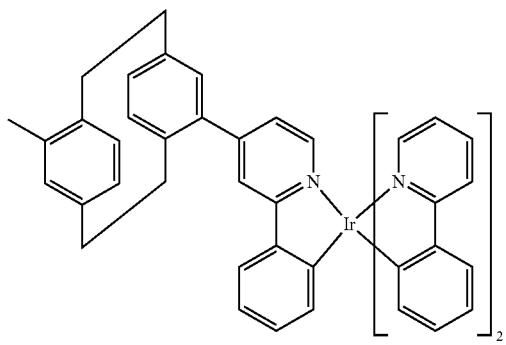
EX2
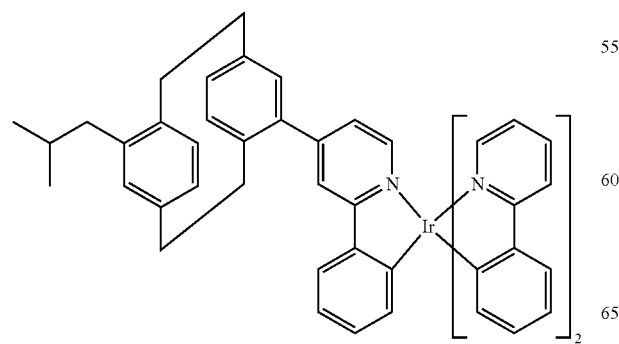
EX3
EX4
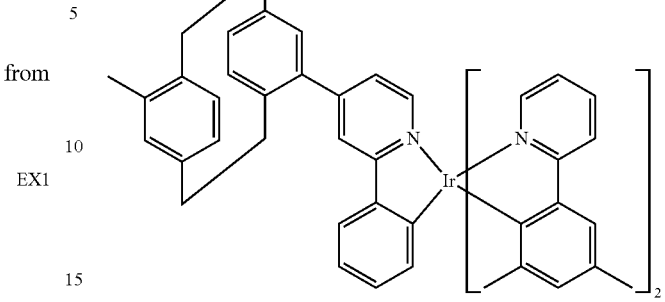
EX5
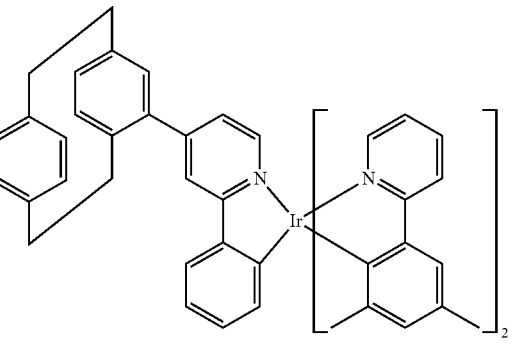
EX6
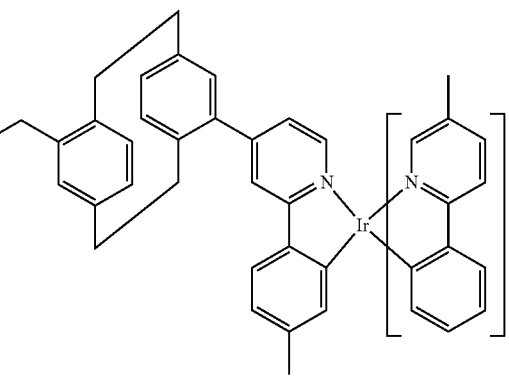
EX7
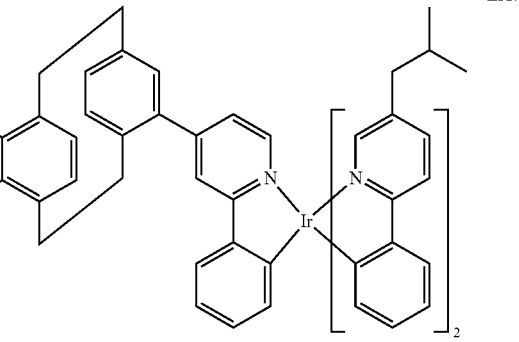
EX8
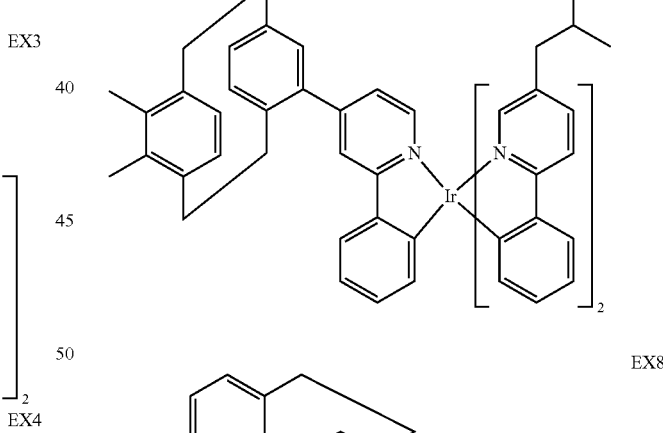

EX9
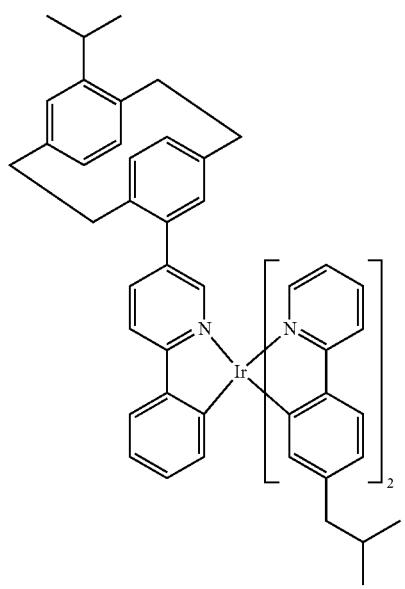
EX10
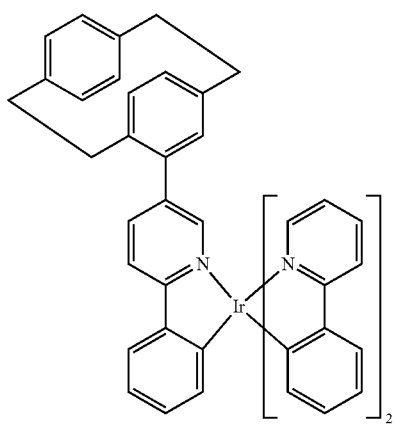
EX11
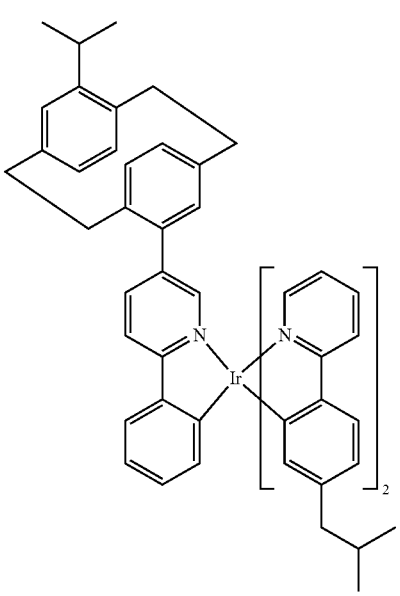
EX12
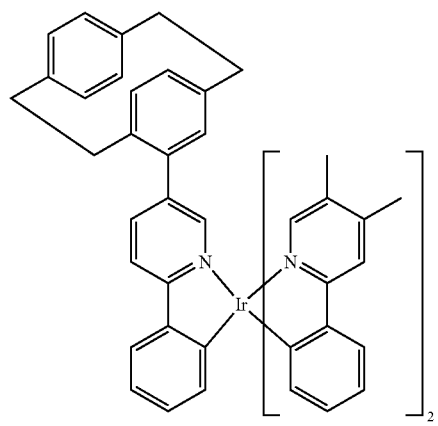
EX13
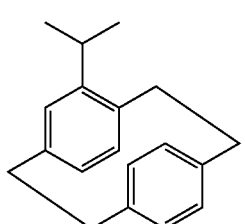
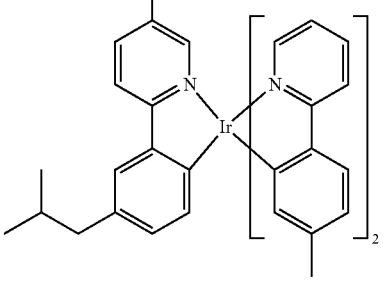
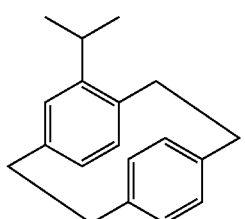
and
EX14
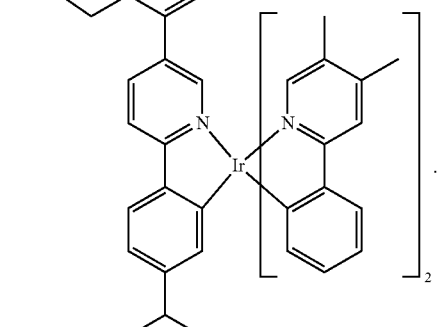
2. An organic electroluminescence device comprising a pair of electrodes consisting of a cathode and an anode, and between the pairs of electrodes, the organic electroluminescence device comprising at least a light emitting layer, and one or more layers of organic thin film layer, wherein the light emitting layer comprises the paracyclophane-based iridium complexes according to claim 1.

3. The organic electroluminescence device according to claim 2, wherein the light emitting layer comprises an emitting dopant that is the paracyclophane-based iridium complex.

4. The organic electroluminescence device according to claim 2, wherein the light emitting layer comprises two or three types of emitting dopant of the paracyclophane-based iridium complexes.

5. The organic electroluminescence device according to claim 2, wherein the light emitting layer comprises an emitting host with one of the following formulas:

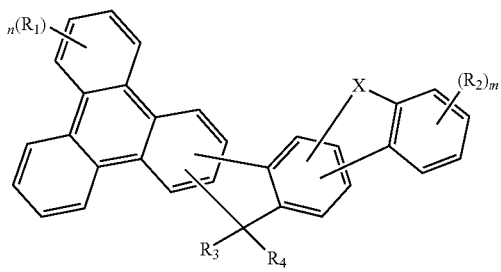

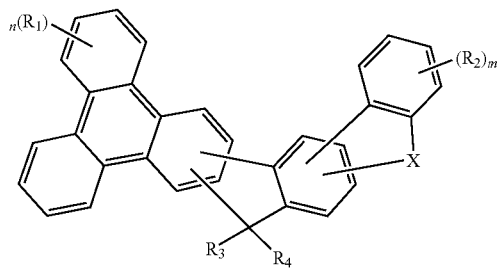

wherein X is a divalent bridge selected from the atom or group consisting from O, S, $C(R_8)_2$, $N(R_9)$ and $Si(R_{10})_2$, m represents an integer of 0 to 4, n represents an integer of 0 to 8, $R_1$ to $R_4$ and $R_8$ to $R_{10}$ are independently selected from the group consisting of a hydrogen atom, a deuterium, a halide, a substituted or unsubstituted alkyl group having 1 to 20 carbon atoms, a substituted or unsubstituted aryl group having 6 to 30 carbon atoms, and a substituted or unsubstituted heteroaryl group having 3 to 30 carbon atoms.

6. The organic electroluminescence device according to claim 2, wherein the light emitting layer comprises two or three types of emitting host each independently having one of the following formulas:

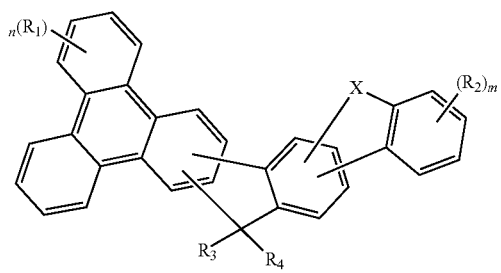

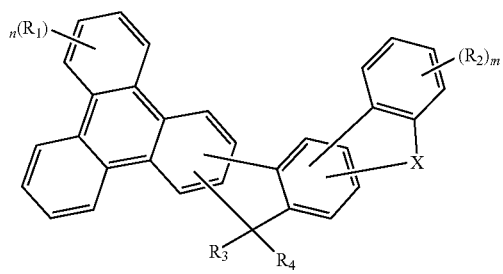

wherein X is a divalent bridge selected from the atom or group consisting from O, S, $C(R_8)_2$, $N(R_9)$ and $Si(R_{10})_2$, m represents an integer of 0 to 4, n represents an integer of 0 to 8, $R_1$ to $R_4$ and $R_8$ to $R_{10}$ are independently selected from the group consisting of a hydrogen atom, a deuterium, a halide, a substituted or unsubstituted alkyl group having 1 to 20 carbon atoms, a substituted or unsubstituted aryl group having 6 to 30 carbon atoms, and a substituted or unsubstituted heteroaryl group having 3 to 30 carbon atoms.

7. The organic electroluminescence device according to claim 2, wherein the light emitting host is selected from the group consisting of:

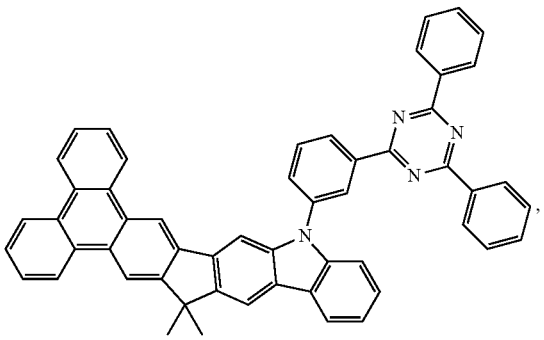

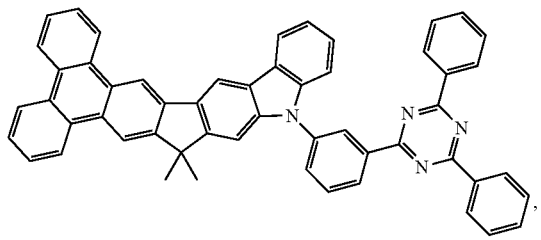

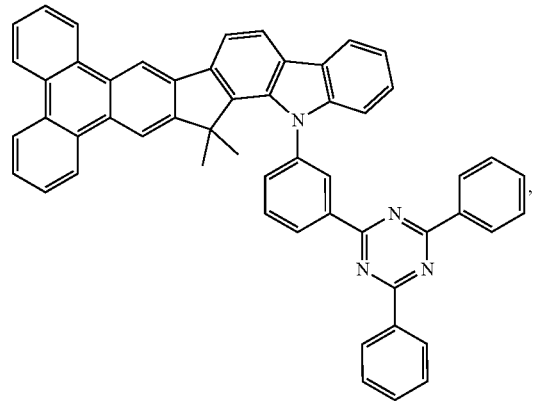

-continued

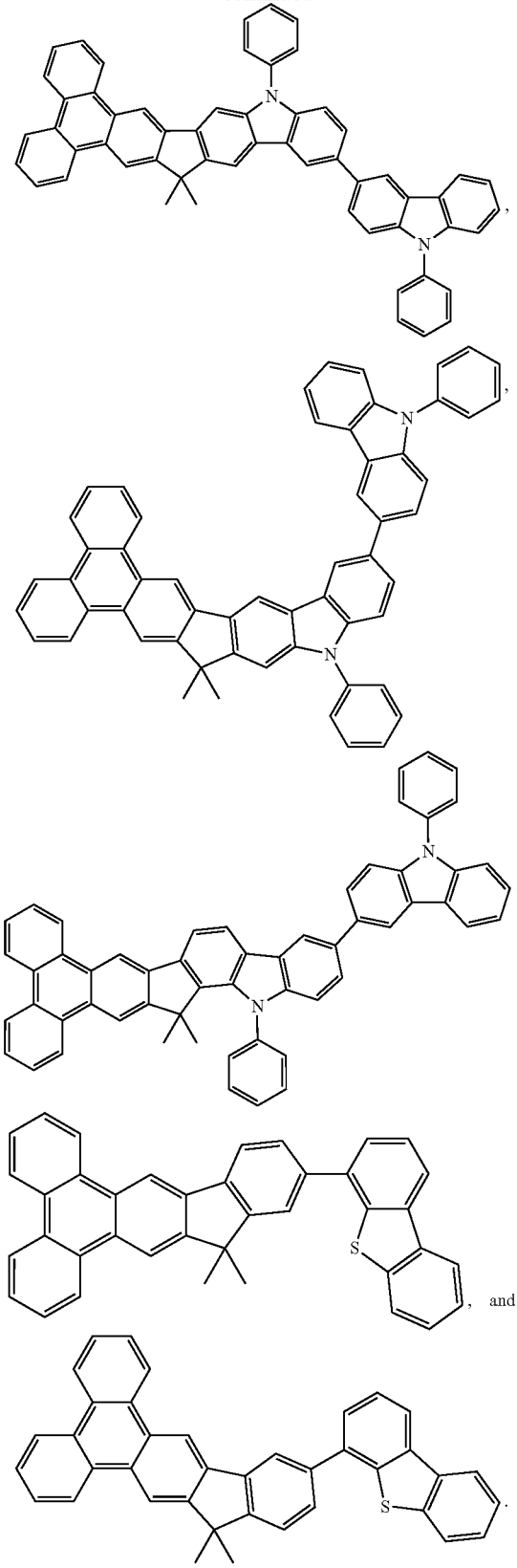

8. The organic electroluminescence device according to claim 2, wherein the light emitting layer emits phosphorescent red, orange, green and yellow lights.

9. The organic electroluminescence device according to claim 2, wherein the device is an organic light emitting device.

10. The organic electroluminescence device according to claim 2, wherein the device is a lighting panel.

11. The organic electroluminescence device according to claim 2, wherein the device is a backlight panel.

12. A paracyclophane-based iridium complex selected from the group consisting of:

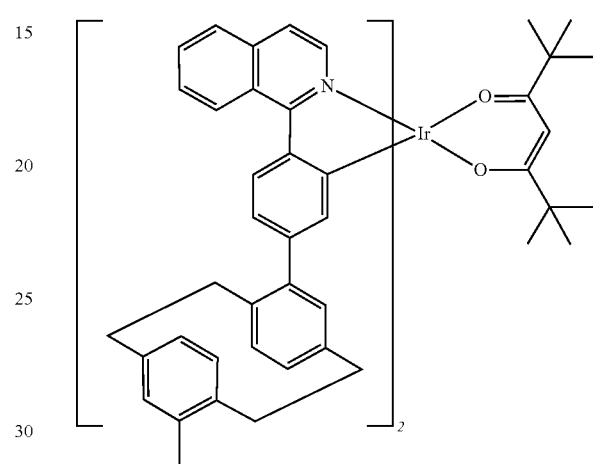

EX16

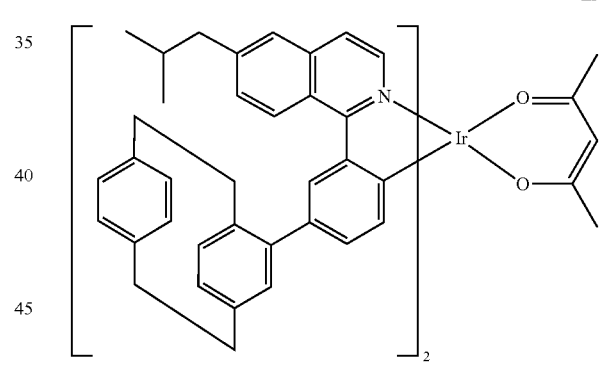

EX17

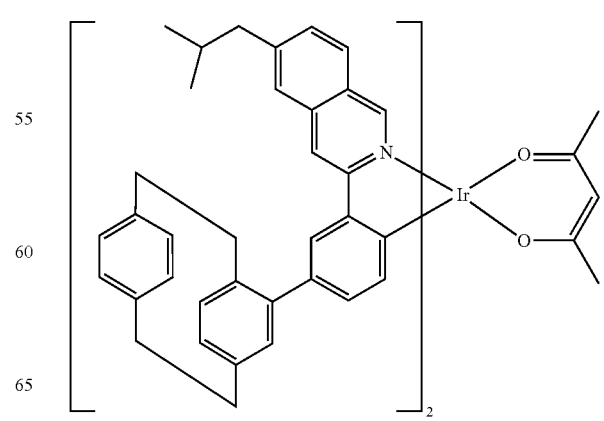

EX18

-continued

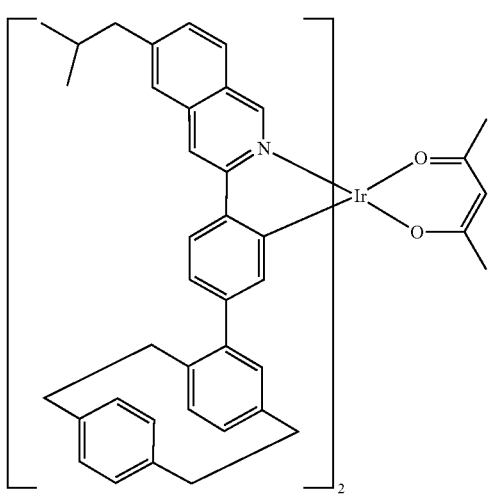
EX19

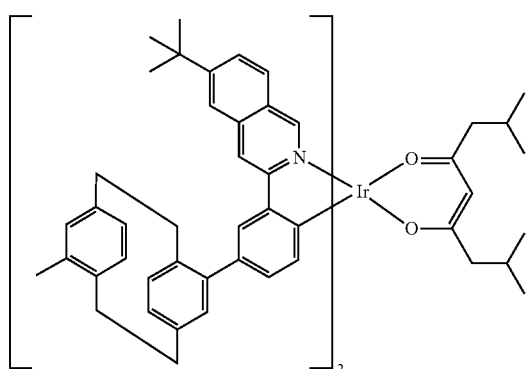
EX20

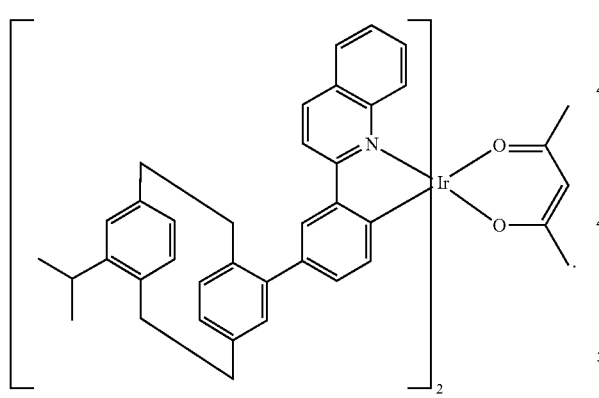
EX21

13. An organic electroluminescence device comprising a pair of electrodes consisting of a cathode and an anode, and between the pairs of electrodes, the organic electroluminescence device comprising at least a light emitting layer, and one or more layers of organic thin film layer, wherein the light emitting layer comprises the paracyclophane-based iridium complexes according to claim 12.

14. The organic electroluminescence device according to claim 13, wherein the light emitting layer comprises an emitting dopant that is the paracyclophane-based iridium complex.

15. The organic electroluminescence device according to claim 13, wherein the light emitting layer comprises two or three types of emitting dopant of the paracyclophane-based iridium complexes.

16. The organic electroluminescence device according to claim 13, wherein the light emitting layer comprises an emitting host with one of the following formulas:

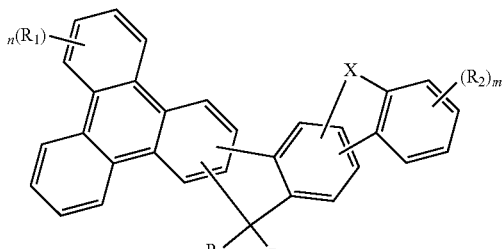

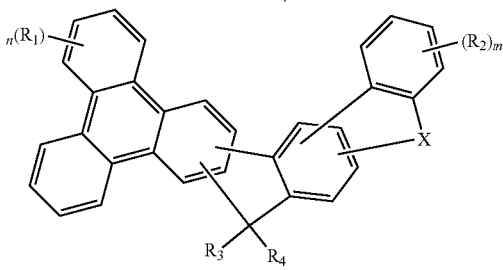

wherein X is a divalent bridge selected from the atom or group consisting from O, S, $C(R_8)_2$, $N(R_9)$ and $Si(R_{10})_2$, m represents an integer of 0 to 4, n represents an integer of 0 to 8, $R_1$ to $R_4$ and $R_8$ to $R_{10}$ are independently selected from the group consisting of a hydrogen atom, a deuterium, a halide, a substituted or unsubstituted alkyl group having 1 to 20 carbon atoms, a substituted or unsubstituted aryl group having 6 to 30 carbon atoms, and a substituted or unsubstituted heteroaryl group having 3 to 30 carbon atoms.

17. The organic electroluminescence device according to claim 13, wherein the light emitting layer comprises two or three types of emitting host each independently having one of the following formulas:

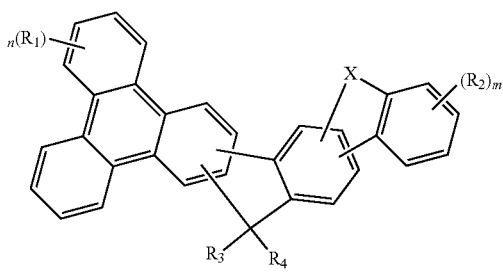

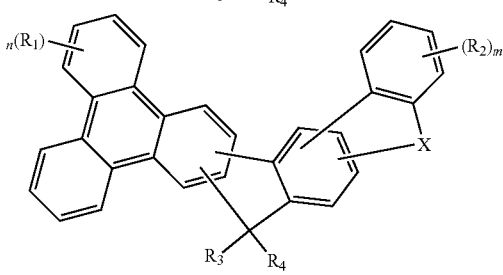

wherein X is a divalent bridge selected from the atom or group consisting from O, S, $C(R_8)_2$, $N(R_9)$ and $Si(R_{10})_2$, m represents an integer of 0 to 4, n represents an integer of 0 to 8, $R_1$ to $R_4$ and $R_8$ to $R_{10}$ are independently selected from the group consisting of a hydrogen atom, a deuterium, a halide, a substituted or unsubstituted alkyl group having 1 to 20 carbon atoms, a substituted or unsubstituted aryl group having 6 to 30 carbon atoms, and a substituted or unsubstituted heteroaryl group having 3 to 30 carbon atoms.

* * * * *